(12) United States Patent
Kondo et al.

(10) Patent No.: US 8,073,058 B2
(45) Date of Patent: Dec. 6, 2011

(54) MEMORY DEVICE AND DEVICE AND METHOD FOR DETECTING MOTION VECTOR

(75) Inventors: Tetsujiro Kondo, Tokyo (JP); Wataru Niitsuma, Tokyo (JP); Naoki Kobayashi, Tokyo (JP)

(73) Assignee: Sony Corporation, Tokyo (JP)

( * ) Notice: Subject to any disclaimer, the term of this patent is extended or adjusted under 35 U.S.C. 154(b) by 96 days.

(21) Appl. No.: 12/559,212

(22) Filed: Sep. 14, 2009

(65) Prior Publication Data

US 2010/0002774 A1  Jan. 7, 2010

Related U.S. Application Data

(62) Division of application No. 10/531,005, filed as application No. PCT/JP03/13204 on Oct. 15, 2003, now Pat. No. 7,626,847.

(30) Foreign Application Priority Data

Oct. 15, 2002 (JP) ................................. 2002-300902
Oct. 15, 2002 (JP) ................................. 2002-300903

(51) Int. Cl.
*H04N 7/12* (2006.01)
*G06K 9/36* (2006.01)

(52) U.S. Cl. .................................. 375/240.16; 382/236
(58) Field of Classification Search .................. 348/699, 348/411, 416, 401, 402, 396, 397, 415, 595, 348/413; 345/547; 375/240.12, 240.01, 375/240.16, 240.24, 240.06, 240.13, 240.14, 375/240.26; 382/107, 232, 236, 238
See application file for complete search history.

(56) References Cited

U.S. PATENT DOCUMENTS 5,134,582 A  7/1992 Ishii
5,926,057 A  7/1999 Ogawa et al.
(Continued)

FOREIGN PATENT DOCUMENTS

EP  0 469 393 A2  7/1991
(Continued)

OTHER PUBLICATIONS

M. Tartagni, et al., "A Low-Power Block-Matching Cell for Video Compression", Analog Integrated Circuits and Signal Processing, vol. 27, No. 3, XP-002568279, Jul. 1, 2001, p. 261-273.

(Continued)

*Primary Examiner* — Behrooz Senfi
(74) *Attorney, Agent, or Firm* — Oblon, Spivak, McClelland, Maier & Neustadt, L.L.P.

(57) ABSTRACT

This invention relates to a memory device and the like that are preferably applied to a case where motion vector is detected using a block matching. Pixel data of a first frame (a reference frame) is stored in a unit A of memory cell array portion 20a in straight binary format. Pixel data of a second frame (a search frame) is stored in a unit B of memory cell array portion 20b in two's complement format. The units A and B have a plurality of memory cells, respectively. Word lines WL related to the pixel data of the first and second frames are simultaneously activated so that charges accumulated in capacitors of each of the memory cells can be combined along one bit line BL. A/D converter 53 outputs a digital signal (absolute difference value) having a value that corresponds to a total amount of charges. When reading the pixel data, a subtraction and a conversion into the absolute difference value are simultaneously performed.

5 Claims, 23 Drawing Sheets

U.S. PATENT DOCUMENTS

| | | | |
|---|---|---|---|
| 7,477,289 B2 * | 1/2009 | Kondo et al. | 348/208.4 |
| 7,573,939 B2 | 8/2009 | Kondo et al. | |
| 2003/0053544 A1 * | 3/2003 | Yasunari et al. | 375/240.16 |
| 2009/0154566 A1 * | 6/2009 | Kondo et al. | 375/240.16 |
| 2010/0026903 A1 * | 2/2010 | Tetsukawa et al. | 348/699 |

FOREIGN PATENT DOCUMENTS

| | | |
|---|---|---|
| EP | 0 469 393 A3 | 7/1991 |
| EP | 0 725 356 A2 | 8/1996 |
| EP | 0 725 356 A3 | 8/1996 |
| JP | 58-155592 | 9/1983 |
| JP | 7-203457 | 8/1995 |
| JP | 8-31168 | 2/1996 |
| JP | 8-204567 | 8/1996 |
| JP | 9-244875 | 9/1997 |
| JP | 11-177892 | 7/1999 |
| JP | 2000-035878 | 2/2000 |
| JP | 2000-333183 | 11/2000 |
| JP | 2003-109380 | 4/2003 |
| JP | 2003-208303 | 7/2003 |
| JP | 2003-209846 | 7/2003 |
| JP | 2003-257183 | 9/2003 |
| JP | 2003-289545 | 10/2003 |

OTHER PUBLICATIONS

M. Tartagni, et al., "A Block-Matching Module for Video Compression", IEEE Symposium on Low Power Electronics, Oct. 10, 1994, pp. 24-25.

* cited by examiner

FIG. 8A   FIG. 8B   FIG. 8C
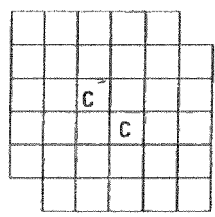
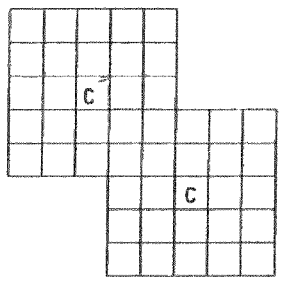
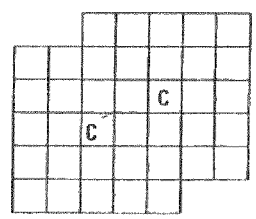
FIG. 9
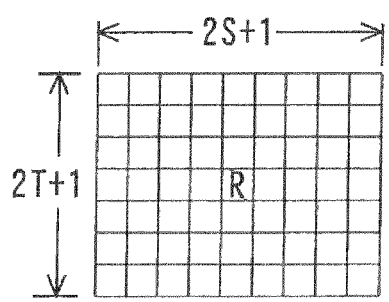

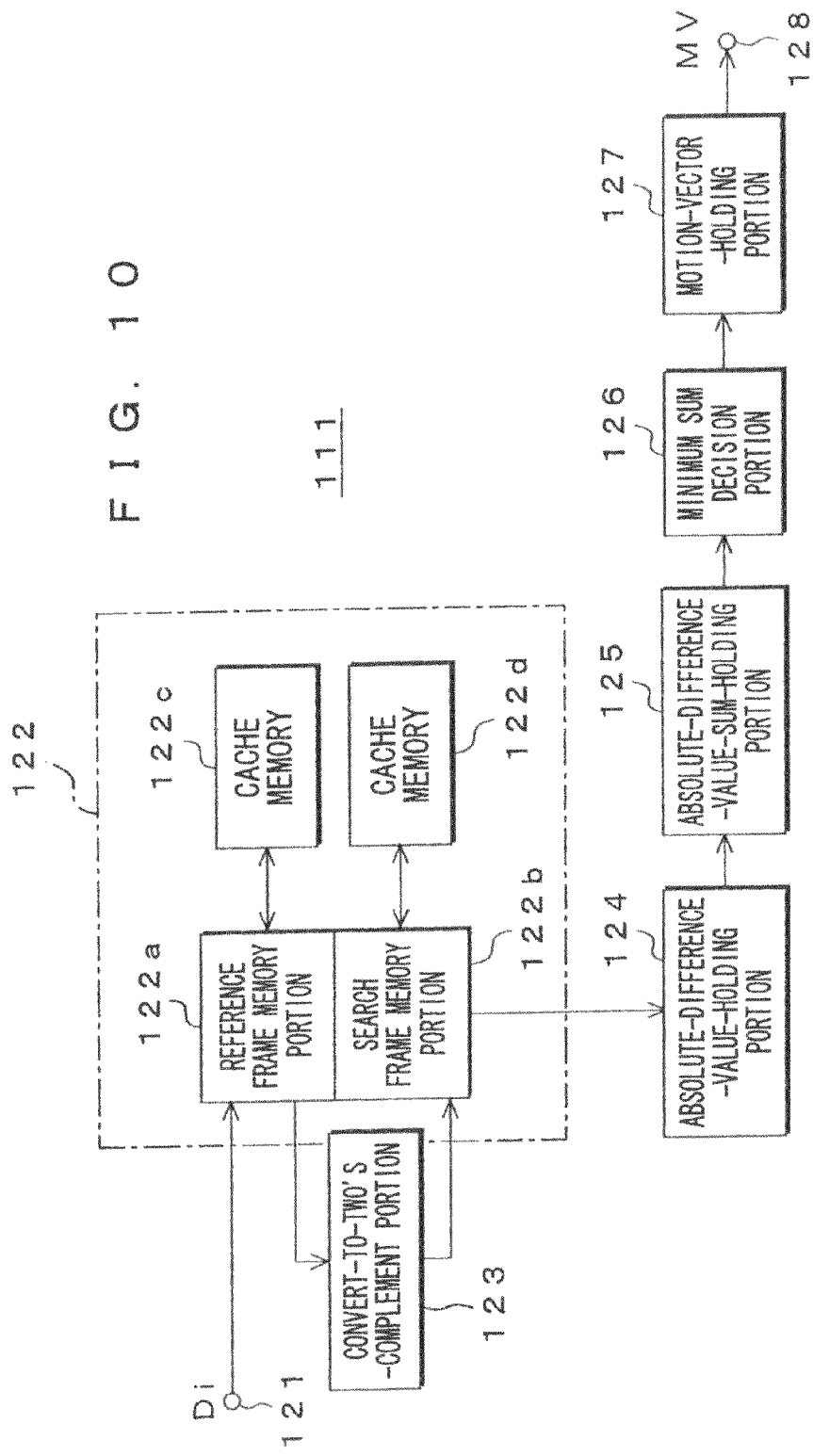

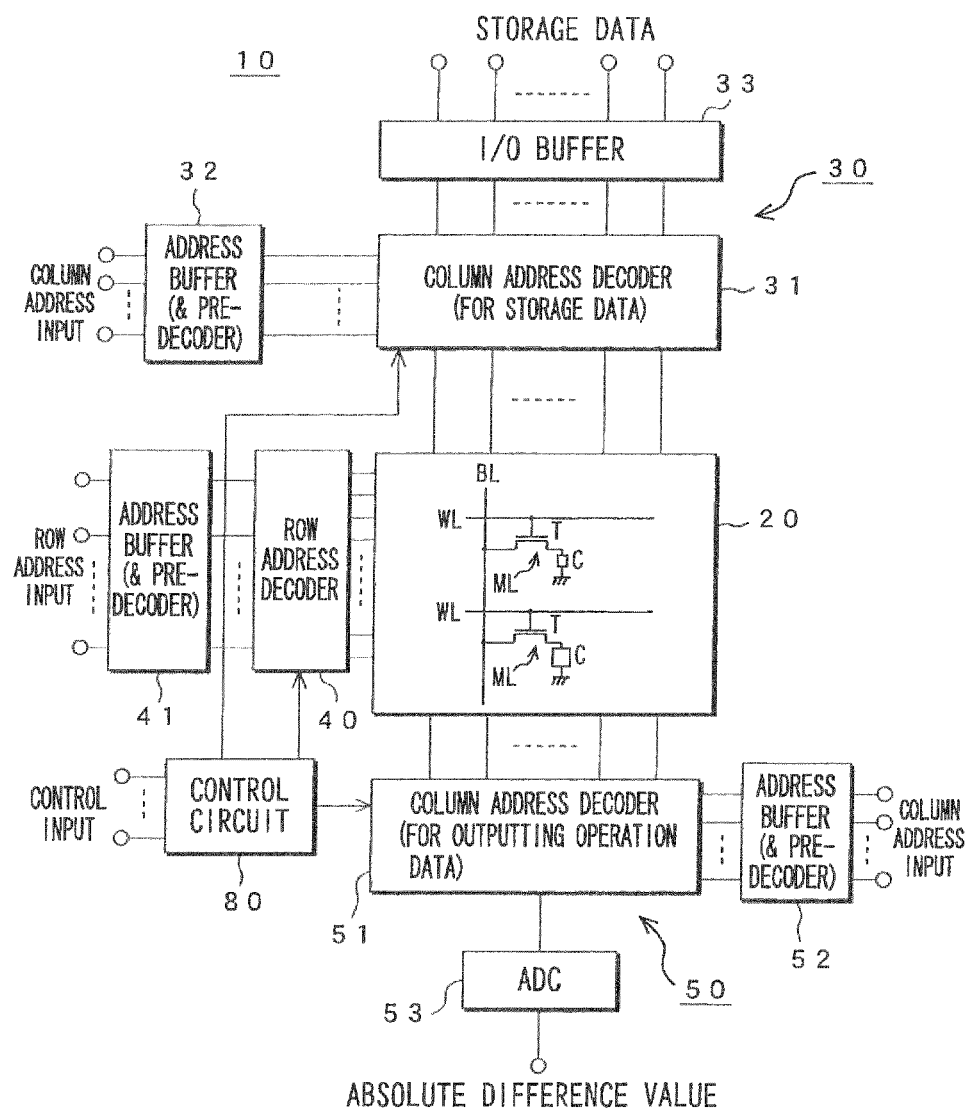

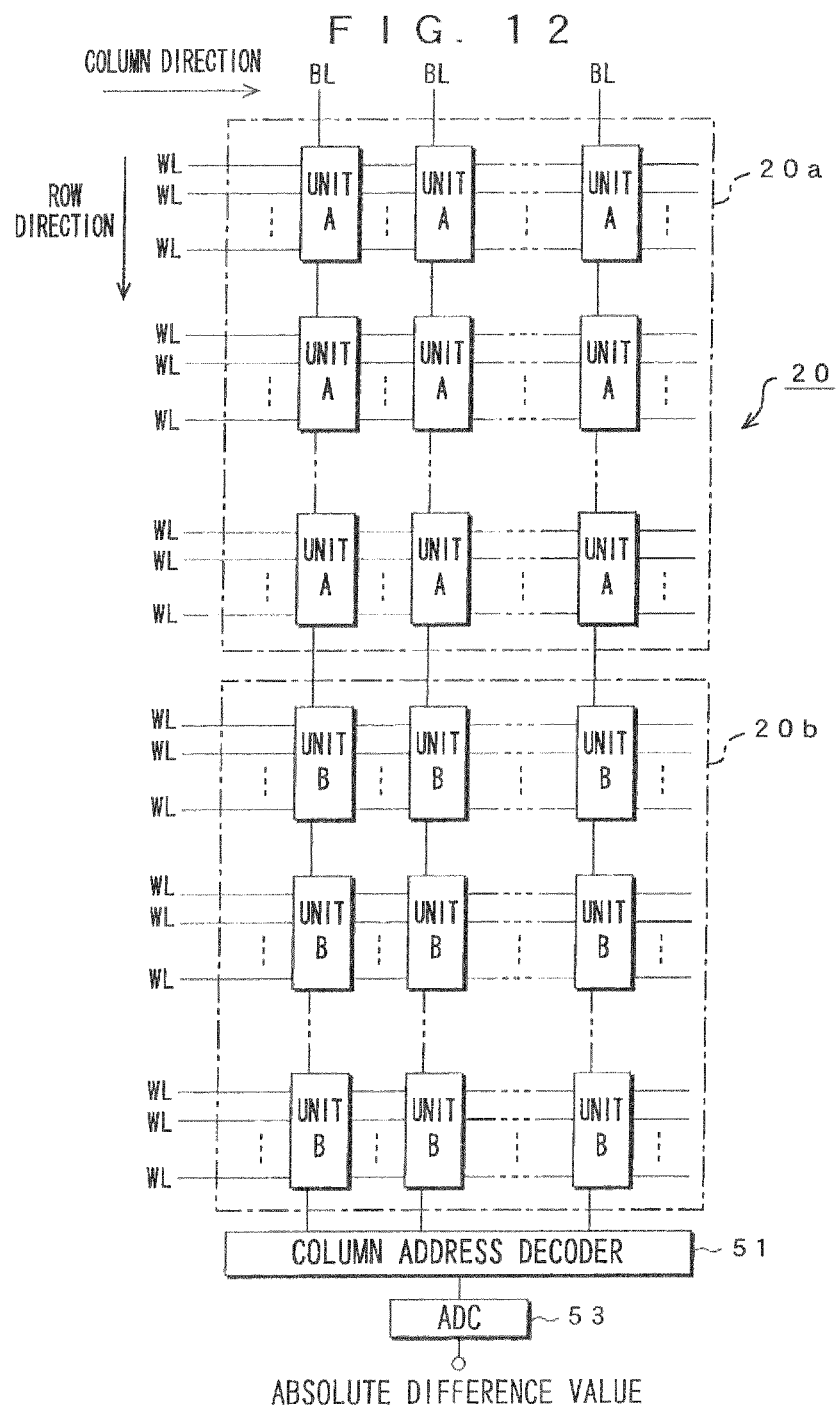

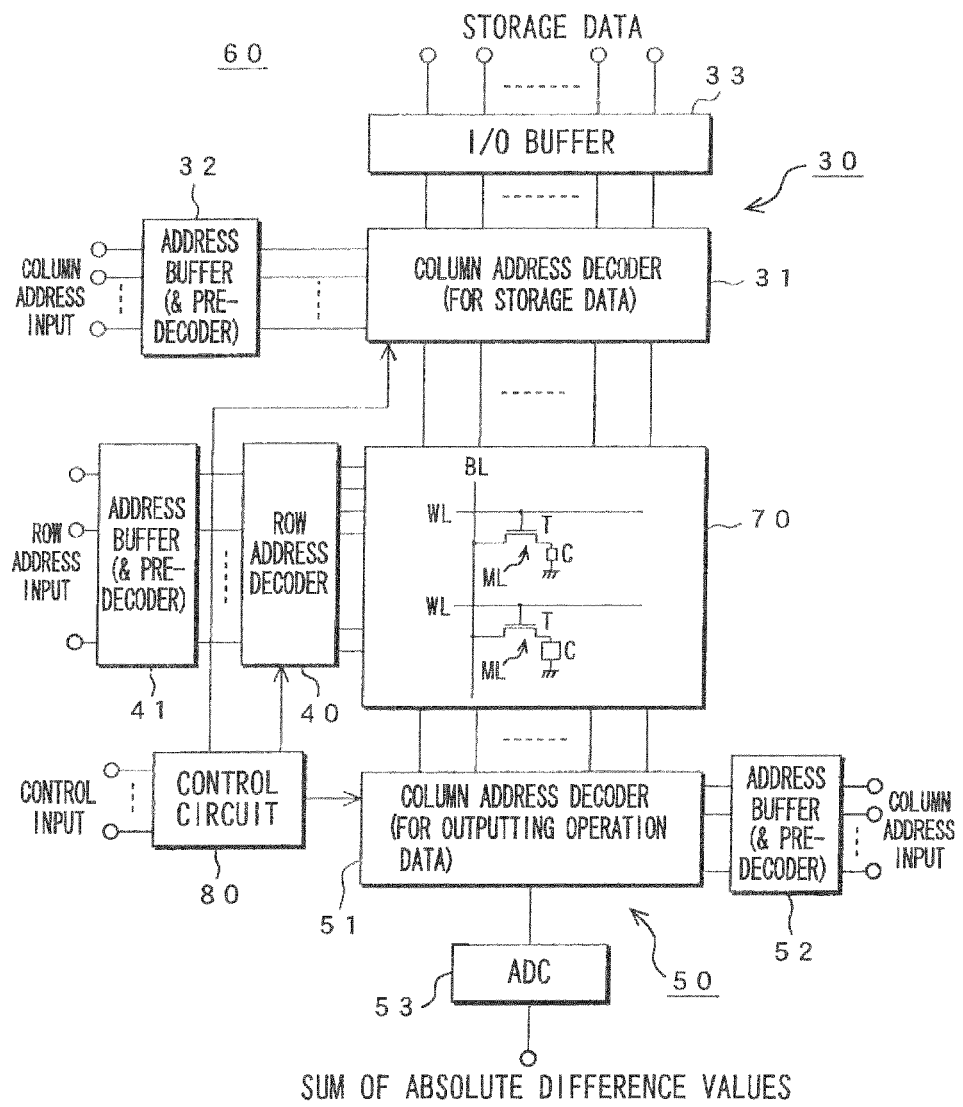

F I G. 2 1
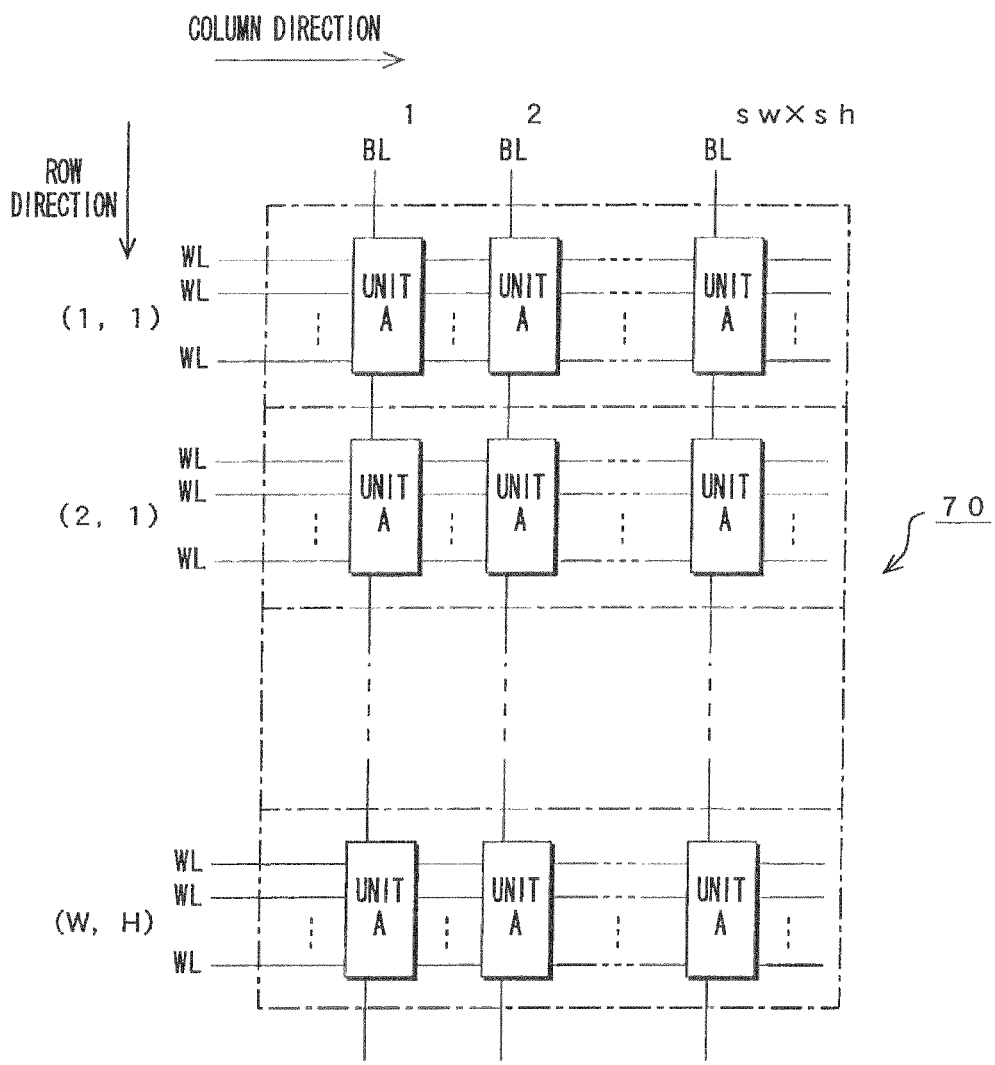

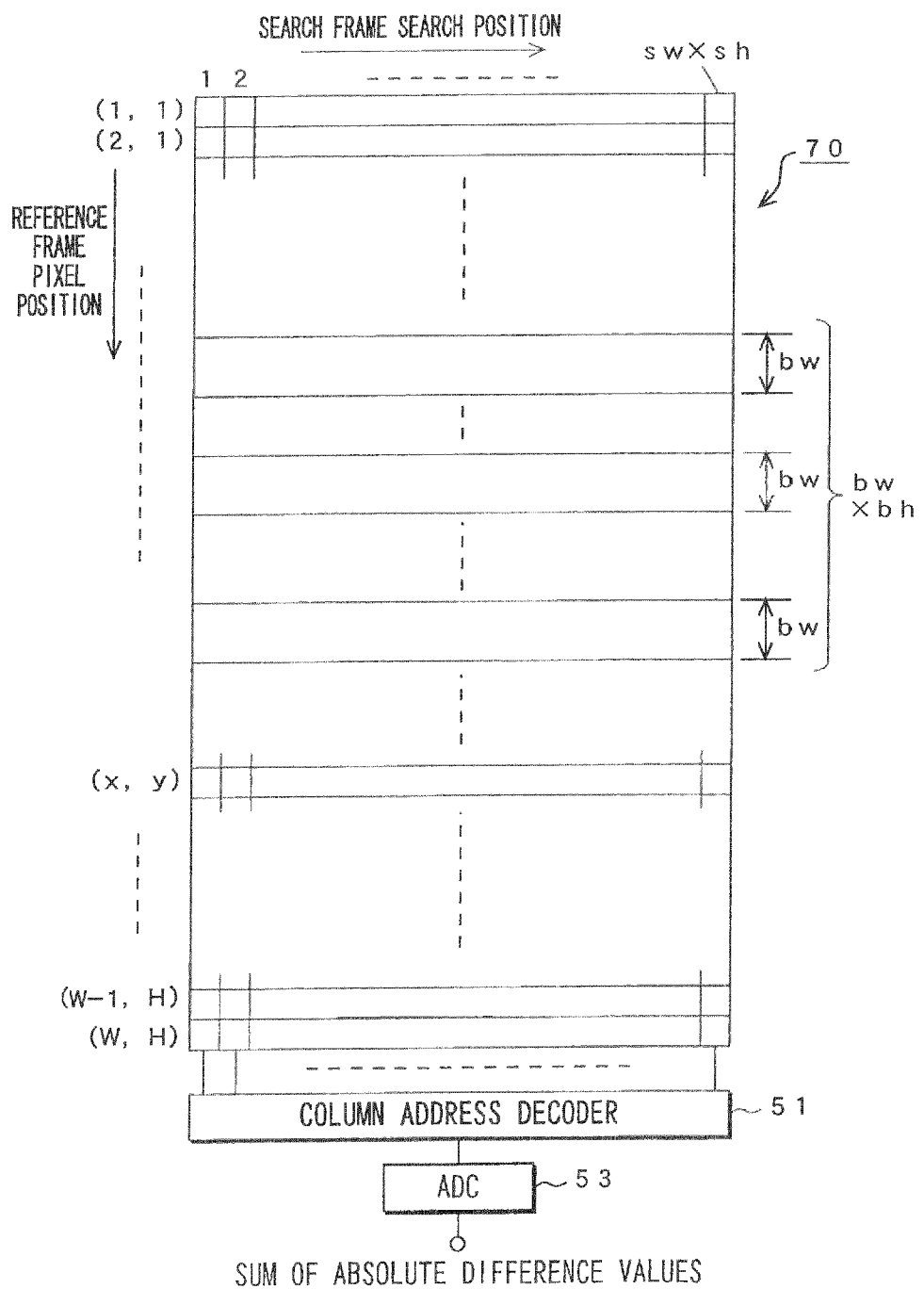

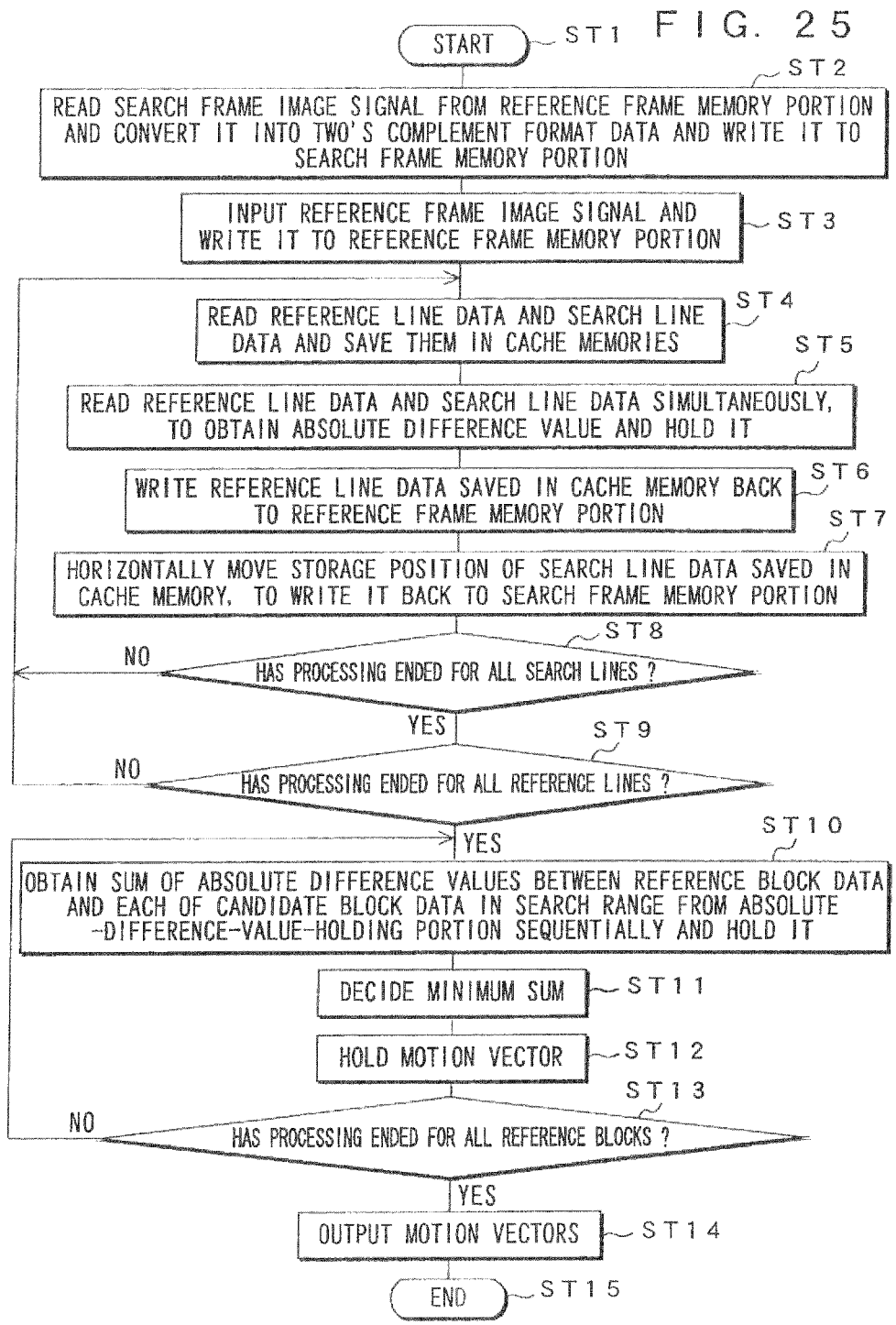

MEMORY DEVICE AND DEVICE AND METHOD FOR DETECTING MOTION VECTOR

CROSS-RELATED TO RELATED APPLICATIONS

This application is a divisional of U.S. patent application Ser. No. 10/531,005, filed on Apr. 12, 2005, the entire content of which is incorporated herein by reference. U.S. patent application Ser. No. 10/531,005 is the National Stage of PCT/JP03/13204, filed on Oct. 15, 2003, which claims priority to Japanese Application No. 2002-300902, filed on Oct. 15, 2002 and Japanese Application No. 2002-300903, filed on Oct. 15, 2002.

TECHNICAL FIELD

The present invention relates to a memory device and a device and method for detecting a motion vector.

More specifically, it relates to a memory device having a configuration for activating a plurality of word lines simultaneously to combine, along one bit line, charges accumulated in capacitors of a plurality of memory cells connected to this plurality of word lines and output a digital signal having a value that corresponds to a total amount of these charges so that data can be read and computed simultaneously, thereby improving a computing speed and reducing costs owing to fewer computing units.

The present invention relates to a memory device having a configuration for storing, in straight binary format, pixel data of a first frame in a unit containing a plurality of memory cells arranged in a direction in which bit lines extend, storing in two's complement format pixel data of a second frame in a unit containing a plurality of memory cells arranged in a direction in which the bit lines extend, and simultaneously activating word lines related to the pixel data of these first and second frames to combine, along one bit line, charges accumulated in capacitors of a plurality of memory cells connected to this plurality of word lines and output a digital signal having a value that corresponds to a total amount of these charges, thereby enabling difference data between the pixel data of the first frame and the pixel data of the second frame to be speedily and inexpensively obtained.

The present invention relates to a memory device having a configuration for storing data in each unit which contains a plurality of memory cells arranged in a direction in which bit lines extend and simultaneously activating word lines related to these plural items of data to combine, along one bit line, charges accumulated in capacitors of the plurality of memory cells connected to this plurality of word lines and output a digital signal having a value that corresponds to a total amount of these charges, thereby enabling added-up data of the plural items of data to be speedily and inexpensively obtained.

The present invention relates to a device and a method for detecting a motion vector having a configuration for generating an absolute difference value, for each pixel of a reference frame, between pixel data thereof and pixel data of a plurality of search positions of a search frame, using this generated absolute difference value to generate a total sum of absolute difference values, for each reference block of the reference frame, between the reference block and respective plural candidate blocks that corresponds to this reference block in a search range of the search frame, and detecting a motion vector in accordance with this reference block based on these generated plural sums of the absolute difference values for each of the reference blocks of the reference frame, thereby enabling the motion vector to be speedily and inexpensively detected.

BACKGROUND ART

FIG. 1 shows a configuration example of a conventional memory block 300. This memory block 300 has a memory cell array 310, a storage data input/output port 320, a row address decoder 330, and a control circuit 340.

The memory cell array 310 has, as shown in FIG. 2, a plurality of bit lines BL for transferring data that extends in a row direction, a plurality of word lines WL that extends in a column direction to intersect with a plurality of the bit lines BL perpendicularly, and memory cells ML that are arranged in a matrix and connected to these bit lines BL and word lines WL.

The memory cell ML is of a DRAM structure and has an access transistor T and a capacitor C. The capacitor C has its one end grounded and the other end connected via the access transistor T to the bit line BL. The access transistor T, on the other hand, has its gate connected to a word line WL. Write or read operation to or from this memory cell ML is implemented by activating the word line WL and turning ON the access transistor T as conventionally well known.

The storage data input/output port 320 has a column address decoder 321, an address buffer 322, and an I/O buffer 323. The column address decoder 321 includes an I/O gate (column switch), a sense-amplifier. The column address decoder 321 is supplied with column addresses via the address buffer 322.

In response to the column addresses supplied via the address buffer 322, the column address decoder 321 secures its connection with a plurality of bit lines BL that is connected to a predetermined plurality of column directional memory cells ML in the memory cell array 310, to enable write or read operation of storage data to or from this predetermined column directional memory cells ML through the I/O buffer 323 and the column address decoder 321.

The row address decoder 330, on the other hand, is supplied with row addresses via an address buffer 331. In response to the row addresses supplied via the address buffer 331, the row address decoder 330 activates a word line WL that is connected to predetermined row directional memory cells ML in the memory cell array 310, to enable write or read operation of storage data to or from this predetermined row directional memory cells ML through the I/O buffer 323 and the column address decoder 321.

Further, the control circuit 340 controls operations of these circuits in the memory block 300 based on a control input.

To perform an operation, for example, addition by use of data stored in the above-described memory block 300, augend data and addend data are read sequentially from the memory block 300 and added up by an adder arranged separately from this memory block 300. Therefore, this method of reading the items of data and performing the operations sequentially leads to a disadvantage that a computing speed cannot be increased. Further, since the computing unit is necessary separately from the memory block 300, costs are increased by that much disadvantageously. This holds true also with any other operations such as subtraction.

Further, in image processing, detection of a motion vector is one of the important factors and typically represented by block matching. According to it, with respect to a certain pixel block (reference block) that constitutes part of a certain frame (reference frame), correlation of the reference block and same-shape pixel blocks (candidate blocks) at various positions in a frame (search frame) at a different time point is evaluated and a relative positional shift of the reference block to the candidate block having the highest correlation is regarded as a motion vector in that reference block.

It is to be noted that the search range is an assumed range of the candidate blocks. In evaluation of the correlation, a total sum of absolute difference values of pixel data, for each in-block pixel, between pixels in the reference block and the corresponding pixels in the candidate block, that is, a sum of absolute difference value is used often. Although a sum of absolute difference value of the candidate block in the search range for each reference block is given, the least sum of absolute difference value thereof is regarded as a motion vector that is given in pixel units.

FIG. 3 shows a configuration example of a conventional motion vector detection circuit 200.

This motion vector detection circuit 200 has an input terminal 201 to which an image signal Di of a reference frame is input, a reference frame memory 202 for accumulating this image signal Di of the reference frame, and a search frame memory 203 for accumulating an image signal of a search frame. When the image signal Di of a certain frame is supplied from the input terminal 201 to the frame memory 202 and written in it, an image signal of the immediately preceding frame stored in this frame memory 202 is read and supplied to the frame memory 203 and written in it.

The motion vector detection circuit 200 further has an arithmetic circuit 204 for receiving pixel data of a reference block from the frame memory 202 and pixel data of a plurality of candidate blocks in a search range that corresponds to this reference block from the frame memory 203 to compute and output, for each of the plurality of candidate blocks, an absolute difference value between each of the items of pixel data in these candidate blocks and the pixel data in the reference block.

This arithmetic circuit 204 obtains difference data by adding up, at an addition portion 204b, pixel data of the reference block and two's complement format pixel data of the candidate block converted by a convert-to-two's-complement portion 204a from straight binary format data and by converting this difference data into its absolute value at a convert-to-absolute portion 204c, thereby giving an absolute difference value.

The motion vector detection circuit 200 further has a total-sum-computing portion 205 for obtaining a sum of absolute difference values by accumulating the absolute difference values output from the arithmetic circuit 204 for each of the items of pixel data corresponding to each of the plurality of candidate blocks and an absolute-difference-value-sum-holding portion 206 for holding the sum of the absolute difference values obtained by this total-sum-computing portion 205 for each of the plurality of candidate blocks.

The motion vector detection circuit 200 further has a minimum sum decision portion 207 for detecting a motion vector based on the sum of the absolute difference values held in the absolute-difference-value-sum-holding portion 206 for each of the plurality of candidate blocks, a motion-vector-holding portion 208 for holding the motion vector detected by this minimum sum detection portion 207, and an output terminal 209 for sequentially outputting a motion vector MV of each of the reference blocks held in this motion-vector-holding portion 208. The minimum sum decision portion 207 detects a position of one of the candidate blocks that generates a minimum sum of absolute difference values, as a motion vector.

The following will describe operations of the motion vector detection circuit 200 shown in FIG. 3.

The image signal Di input to the input terminal 201 is supplied to the reference frame memory 202 and accumulated as a reference frame image signal. At the same time, further, an image signal of the immediately preceding frame stored in the frame memory 202 is read and supplied to the frame memory 203 and accumulated as a search frame image signal.

The arithmetic circuit 204 is supplied with image data of a reference block read from the frame memory 202. This arithmetic circuit 204 is further supplied with read pixel data of a plurality of candidate blocks in a search range that corresponds to this reference block. Then, on respective candidate blocks, this arithmetic circuit 204 computes an absolute difference value between the items of pixel data of the plurality of candidate blocks and the items of pixel data of the reference block, for each of the items of the corresponding pixel data, and outputs it.

In such a manner, the absolute difference value output from the arithmetic circuit 204 for each of the items of pixel data corresponding to each of the plurality of candidate blocks is sequentially supplied to the total-sum-computing portion 205, thus obtaining a sum of the absolute values. The sum of the absolute difference values from this total-sum-computing portion 205 for each of the plurality of candidate blocks is supplied to the absolute-difference-value-sum-holding portion 206 and held in it. Based on the sum of the absolute difference values held in the absolute-difference-value-sum-holding portion 206 for each of the plurality of candidate blocks, the minimum sum decision portion 207 detects a position of such one of these candidate blocks as to generate a minimum sum of the absolute difference values as a motion vector, which is held in the motion-vector-holding portion 208.

From the frame memory 202, the arithmetic circuit 204 is supplied with pixel data of the plurality of reference blocks in a reference frame sequentially. Corresponding to the pixel data in each of the reference blocks, pixel data of the plurality of candidate blocks is supplied from the frame memory 203 to the arithmetic circuit 204. Therefore, corresponding to each of the reference blocks, the above operations are repeated by the arithmetic circuit 204, the total-sum-computing portion 205, the absolute-difference-value-sum-holding portion 206, the minimum sum decision portion 207, and the motion-vector-holding portion 208, so that motion vectors in accordance with the reference blocks are detected by the minimum sum detection circuit 207 sequentially and held in the motion-vector-holding portion 208 sequentially.

The motion vectors in accordance with the reference blocks held in the motion-vector-holding portion 208 are read sequentially. These read motion vectors MV are provided to the output terminal 209. The read motion vectors MV are used in motion compensation processing to perform, for example, motion compensation predictive encoding.

A flowchart of FIG. 4 shows a procedure for detecting a motion vector MV in the above-described motion vector detection circuit 200.

First, at step ST21, the process starts and, at step ST22, reads an image signal stored in the reference frame memory 202 and writes this image signal as an image signal of a search frame into the search frame memory 203. At step ST23, the process inputs the image signal Di of a reference frame from the input terminal 201 and writes this image signal to the reference frame memory 202.

Next, at step ST24, the process reads pixel data of a reference block from the reference frame memory 202 and, at step ST25, reads from the search frame memory 203 pixel data of such a candidate block in a search range as to correspond to that reference block and converts this straight binary format data into two's complement format data at the convert-to-two's-complement portion 204a at step ST26.

At step ST27, the process adds up the straight binary format pixel data of the reference block and pixel data of the candidate block converted into the two's complement format data, to obtain difference data. At step ST28, the process converts that difference data into its absolute value, thus generating an absolute difference value between the pixel data of the reference block and that of the candidate block.

Next, at step ST29, the process computes a sum of the absolute difference values between a certain reference block and predetermined candidate blocks at the total-sum-computing portion 205 and stores it in the holding portion 206 at step ST30. At step ST31, the process decides whether generation of the sum of absolute difference values between the certain reference block and every candidate block has ended. If such is not the case, the process returns to step ST25, to shift to processing of generating a sum of absolute difference values between the certain reference block and the next candidate block. Otherwise, the process goes to step ST32.

At step ST32, the process detects a position of a candidate block that generates a minimum sum of the absolute difference values among them, based on the sums of absolute difference values held in the holding portion 206 corresponding to the certain reference block, as a motion vector. At step ST33, the process stores this detected motion vector in the z motion-vector-holding portion 208.

Next, at step ST34, the process decides whether this processing of detecting the motion vector for all of the reference blocks in the reference frame has ended. If such is not the case, the process returns to step ST24, to shift to processing of detecting a motion vector that corresponds to the next reference block. Otherwise, at step ST35, the process sequentially outputs motion vectors MV that respectively correspond to the reference blocks held in the motion-vector-holding portion 208 and, at step ST36, ends the processing.

The above motion vector detection circuit 200 has had a disadvantage of higher costs due to a necessity of the circuits for computing difference data, an absolute value, a total sum, etc. as arithmetic circuits.

DISCLOSURE OF THE INVENTION

It is an object of the present invention to provide a memory device that enables simultaneous processing of data reading and computing, to improve a computing speed and reduce costs due to a decrease in number of the computing units.

It is another object of the present invention to provide a memory device that can obtain difference data between pixel data of a first frame and that of a second frame speedily and inexpensively.

It is a further object of the present invention to provide a memory device that can obtain added-up data of plural items of data speedily and inexpensively.

It is a still further object of the present invention to provide a device and a method for detecting motion vector, which can detect a motion vector speedily and inexpensively.

A memory device according to the invention allows charges accumulated in capacitors of a plurality of memory cells connected to a plurality of activated word lines to be combined along one bit line, the device comprising activation means for activating the plurality of word lines simultaneously, and signal output means for outputting a digital signal having a value that corresponds to a total amount of charges obtained along the one bit line by combining the charges accumulated in the capacitors of the plurality of memory cells connected to the plurality of word lines activated by the activation means.

In the present invention, a plurality of word lines is activated simultaneously. Accordingly, charges accumulated in capacitors of a plurality of memory cells connected to this plurality of activated word lines are combined along one bit line. A digital signal having a value that corresponds to a total amount of these charges is output.

For example, the digital signal having a value that corresponds to the total amount of charges can be obtained by converting the total amount of charges into a voltage signal having a value that corresponds to this total amount of charges and converting this voltage signal from an analog signal into a digital signal. In this case, when converting the voltage signal into the digital signal, this digital signal can be of an arbitrary tone depending on functions of an A/D converter.

It is to be noted that by activating a plurality of word lines related to at least two items of data simultaneously, a result of computing these at least two items of data is obtained as the digital signal. For example, by storing data to be added in each unit comprised of a plurality of memory cells connected to a plurality of word lines related to each data, a result of adding up the items of data is obtained as the digital signal. Further, for example, by storing minuend data or subtrahend data in each unit comprised of a plurality of memory cells connected to a plurality of word lines related to each of the items of data, a result of subtraction between these items of data is obtained as the digital signal. In this case, for example, the minuend data is supposed to be straight binary format data and the subtrahend data, two's complement format data.

Such a configuration that by activating a plurality of word lines simultaneously and combining charges accumulated in capacitors of a plurality of memory cells connected to this plurality of word lines along one bit line, a digital signal having a value that corresponds to a total amount of these charges is output allows the data to be simultaneously to be read and computed, thereby enabling improvement in computing speed and reduction in costs owing to a decrease in number of computing units required.

It is to be noted that by providing such a configuration that some of the plurality of memory cells connected to one bit line may have different capacitance of their capacitors, the number of memory cells required to store one items of data can be reduced. For example, if one item of data has N number of bits (N is a positive integer), N number of word lines are related to this one item of data and the capacitors of N number of memory cells connected to these N number of word lines respectively are each given as capacitance in accordance with weight of each bit of the data having these N number of bits. Accordingly, only N a number of memory cells is required to store data having N number of bits. In contrast, if the memory cells have the same capacitance of their capacitors, $(2^N-1)$ number of memory cells is required to store N-bit data.

A memory device according to the invention comprises a first frame memory portion including a plurality of memory cells connected to bit lines and word lines, respectively, and arranged in a matrix, to store an image signal of a first frame, and a second frame memory portion including a plurality of memory cells connected to the bit lines and word lines, respectively, and arranged in the matrix, to store an image signal of a second frame, wherein the first frame memory portion and the second frame memory portion are formed consecutively in a row direction, in which the bit lines extend, wherein, in the first frame memory portion and the second frame memory portion, charges accumulated in capacitors of a plurality of memory cells connected to a plurality of activated word lines can be combined along one bit line, wherein, in each of the first frame memory portion and the second frame memory portion, a plurality of memory cells connected to each of the bit lines is divided into units, each including a predetermined number of memory cells that are connected to a predetermined number of word lines, to store one item of pixel data in each of these divided units, wherein each unit of the first frame memory portion stores pixel data of an image signal of the first frame in straight binary format and each unit of the second frame memory portion stores pixel data of an image signal of the second frame in two's complement format, and wherein the memory device further comprises activation means for simultaneously activating a plurality of word lines related to predetermined data in the first frame memory portion and a plurality of word lines related to predetermined data in the second frame memory portion, bit line selection means for selecting any one of the plurality of bit lines, and signal output means for outputting a digital signal having a value that corresponds to a total amount of charges obtained along the bit line selected by the bit line selection means.

In the present invention, first and second frame memory portions are provided. These frame memory portions are each connected to bit lines and word lines and have a plurality of memory cells arranged in a matrix. In these frame memory portions, it is possible to combine charges accumulated in capacitors of a plurality of memory cells connected to a plurality of activated word lines, along one bit line. These frame memory portions are formed consecutively in a row direction in which the bit lines extend.

Further, in each of these frame memory portions, a plurality of memory cells connected to each bit line is divided into units each of which is comprised of a predetermined number of memory cells that is connected to a predetermined number of word lines, so that each of these divided units stores one item of pixel data. Each unit of the first frame memory portion stores pixel data of an image signal of a first frame in straight binary format and each unit of the second frame memory portion stores pixel data of an image signal of a second frame in two's complement format.

In this configuration, by simultaneously activating a plurality of word lines related to predetermined data in the first frame memory portion and a plurality of word lines related to predetermined data in the second frame memory portion, charges accumulated in capacitors of a plurality of memory cells connected to the plurality of activated word lines are combined along each bit line. A digital signal having a value that corresponds to a total amount of the charges obtained along a selected bit line is output.

As described above, each unit of the first frame memory portion stores pixel data of an image signal of a first frame in straight binary format and each unit of the second frame memory portion stores pixel data of an image signal of a second frame in two's complement format, so that the total amount of charges obtained along each bit line corresponds to a difference value between the pixel data of the first frame and that of the second frame. Accordingly, a result of subtraction between the pixel data of the first frame and that of the second frame is obtained as the above-described digital signal.

By thus storing pixel data of a first frame in a unit comprised of a plurality of memory cells arranged in the direction in which the bit lines extend in straight binary format and storing pixel data of a second frame in a unit comprised of a plurality of memory cells arranged in the direction in which the bit lines extend in two's complement data format and simultaneously activating word lines related to the pixel data of these first and second frames to combine charges accumulated in capacitors of a plurality of memory cells connected to this plurality of word lines, along one bit line and output a digital signal having a value that corresponds to a total amount of these charges, it is possible to obtain difference data between the pixel data of the first frame and that of the second frame speedily and inexpensively.

In this case, by changing positions of such lines in the second frame memory portion as to be activated with respect to the lines in the first frame memory portion to be activated, it is possible to obtain a result of subtraction between the pixel data of the predetermined lines of the first frame and the pixel data of lines of the second frame at a position shifted by a predetermined number of lines vertically (in the row direction).

Further, by moving horizontally (in the column direction) a storage position of the pixel data stored in the first or second frame memory portion, it is possible to obtain a result of subtraction between the pixel data in a predetermined pixel of the first frame and the pixel data in pixels of the second frame at positions shifted by a predetermined number of pixels horizontally.

It is to be noted that if a plurality of word lines related to predetermined data in the first frame memory portion and a plurality of word lines related to predetermined data in the second frame memory portion are activated simultaneously, as described above the charges accumulated in the capacitors of a plurality of memory cells connected to these word lines are combined along a bit line and output. Therefore, after the accumulated charges are combined, the data stored in this plurality of memory cells is rendered meaningless (destroyed). For this reason, by saving the pixel data of each line stored in the first and second frame memory portions, respectively, in a cache memory etc. before activating the word lines, the storage data of the plurality of memory cells once rendered meaningless can be restored to the original state.

For example, if one item of pixel data has N number of bits (N is a positive integer), N number of word lines related to this one item of data are used and the capacitors of N number of memory cells connected to these N number of word lines respectively have capacitance corresponding to weight of each bit of the data having N number of bits. Accordingly, only N number of memory cells is required to store data having N number of bits. In contract, if the memory cells have the same capacitance of their capacitors, $(2^N-1)$ number of memory cells are required to store N-bit data.

A memory device according to the invention comprises a memory portion including a plurality of memory cells connected to bit lines and word lines, respectively, and arranged in a matrix, wherein, in the memory portion, charges accumulated in capacitors of a plurality of memory cells connected to a plurality of activated word lines can be combined along one bit line, and wherein, in the memory portion, a plurality of memory cells connected to each of the bit lines is divided into units, each including a predetermined number of memory cells that are connected to a predetermined number of word lines, to store one item of data in each of these divided units, the memory device further comprising activation means for simultaneously activating word lines related to plural items of data, bit line selection means for selecting any one of the plurality of bit lines, and signal output means for outputting a digital signal having a value that corresponds to a total amount of charges obtained along the bit line selected by the bit line selection means.

In the present invention, memory portions are provided each of which is connected to bit lines and word lines and comprised of a plurality of memory cells arranged in a matrix. In this memory portion, it is possible to combine charges accumulated in capacitors of a plurality of memory cells connected to a plurality of activated word lines, along one bit line. In each of these frame memory portions, a plurality of memory cells connected to each bit line is divided into units each of which is comprised of a predetermined number of memory cells that is connected to a predetermined number of word lines, so that each of these divided units stores one items of pixel data.

In this configuration, by activating a plurality of word lines related to plural items of data simultaneously, charges accumulated in capacitors of a plurality of memory cells connected to the plurality of activated word lines are combined along each bit line. A digital signal having a value that corresponds to a total amount of the charges obtained along a selected bit line is output. This digital signal corresponds to a result of adding up the plural items of data.

By thus storing the data in the respective units each of which is comprised of a plurality of memory cells arranged in a direction in which the bit lines extend and simultaneously activating word lines related to plural items of data and combining charges accumulated in capacitors of a plurality of memory cells connected to this plurality of word lines along each bit line to output a digital signal having a value that corresponds to a total amount of these charges, it is possible to obtain added-up data of the plural items of data rapidly and inexpensively.

For example, the memory portion has units as many as a number that corresponds to a plurality of pixel positions in one frame in the row direction, in which the bit lines extend, and units as many as a number that corresponds to a search position in the column direction, in which the word lines extend. Each of the plurality of units along each row in this memory portion stores data of an absolute difference value between pixel data of a pixel position in a reference frame and pixel data of each of the search positions of the search frame, correspondingly. In this case, by simultaneously activating word lines related to a unit that corresponds to a pixel position of each of the pixels that constitute a reference block in the reference frame, as the digital signal a sum of absolute differences is obtained between the reference block in the reference frame and each of the plurality of candidate blocks in the search range of the search frame corresponding to this reference block.

A motion vector detection device according to the invention comprises absolute difference value generation means for using an image signal of a reference frame and an image signal of a search frame, to generate for each pixel of the reference frame an absolute difference value between the pixel data thereof and pixel data of each of the plural search positions of the search frame, absolute difference value sum generation means for using the absolute difference value generated by the absolute difference value generation means, to generate for each reference block of the reference frame a sum of absolute difference values between the reference block and a plurality of candidate blocks, each corresponding to the reference block, in a search range of the search frame, and motion vector detection means for detecting for each of the reference blocks of the reference frame a motion vector that corresponds to the reference block, based on the plural sums of absolute difference values generated by the absolute difference value sum generation means.

A motion vector detection method according to the invention comprises the steps of using an image signal of a reference frame and an image signal of a search frame, to generate for each pixel of the reference frame an absolute difference value between the pixel data thereof and pixel data of a plurality of search positions of the search frame, using the absolute difference value generated by the absolute difference value generation means, to generate for each reference block of the reference frame a sum of absolute difference values between the reference block and a plurality of candidate blocks, each corresponding to the reference block, in a search range of the search frame, and detecting for each of the reference blocks of the reference frame a motion vector that corresponds to the reference block based on a plurality of the sums of absolute difference values thus generated.

In the present invention, by using an image signal of the reference frame and that of the search frame, an absolute difference value between the pixel data thereof and that of each of the plural search positions of the search frame is obtained for each pixel of the reference frame. In this case, all the absolute difference values are generated which are required to obtain motion vectors of all the reference blocks in the reference frame by using block matching.

By using these generated absolute difference values, for each of the reference blocks of the reference frame a sum of absolute difference values is generated between this reference block and a plurality of candidate blocks, each corresponding to this reference block, in a search range of a search frame. In this case, the sum of absolute difference values can be obtained by, for example, adding up absolute difference values between the reference block and the predetermined candidate blocks at a time.

Based on a plurality of sums of absolute difference values thus generated, a motion vector is detected that corresponds to the reference block. In this case, concerning a certain reference block, as a motion vector a position of a candidate block is detected that corresponds to a minimum sum of the absolute difference values among them.

In such a manner, by generating for each pixel of a reference frame an absolute difference value between the pixel data thereof and pixel data of each of the plural search positions of the search frame and using the generated absolute difference values to generate for each reference block of the reference frame a sum of absolute difference values between this reference block and each of the plural candidate blocks in a search range of the search frame corresponding to this reference block to detect a motion vector that corresponds to this reference block based on a plurality of sums of absolute difference values thus generated for each of the reference blocks of the reference frame, it is possible to detect the motion vector speedily and inexpensively.

BRIEF DESCRIPTION OF THE DRAWINGS

FIGS. 8A, 8B, and 8C are diagrams each for further explaining the block matching;

FIG. 9 is a diagram for explaining still further block matching;

FIG. 10 is a block diagram for showing a configuration of a motion vector detection circuit;

FIG. 11 is a block diagram for showing a configuration of a memory block;

FIG. 12 is a diagram for explaining a configuration of a memory cell array;

FIG. 20 is a block diagram for showing a configuration of a block memory;

FIG. 21 is a diagram for explaining a configuration of a memory cell array;

FIG. 22 is a diagram for explaining a configuration of a memory cell array;

FIG. 25 is a flowchart for showing a processing procedure for detecting a motion vector.

BEST MODE FOR CARRYING OUT THE INVENTION

The following will describe embodiments of the present invention with reference to drawings.

Figure 1:
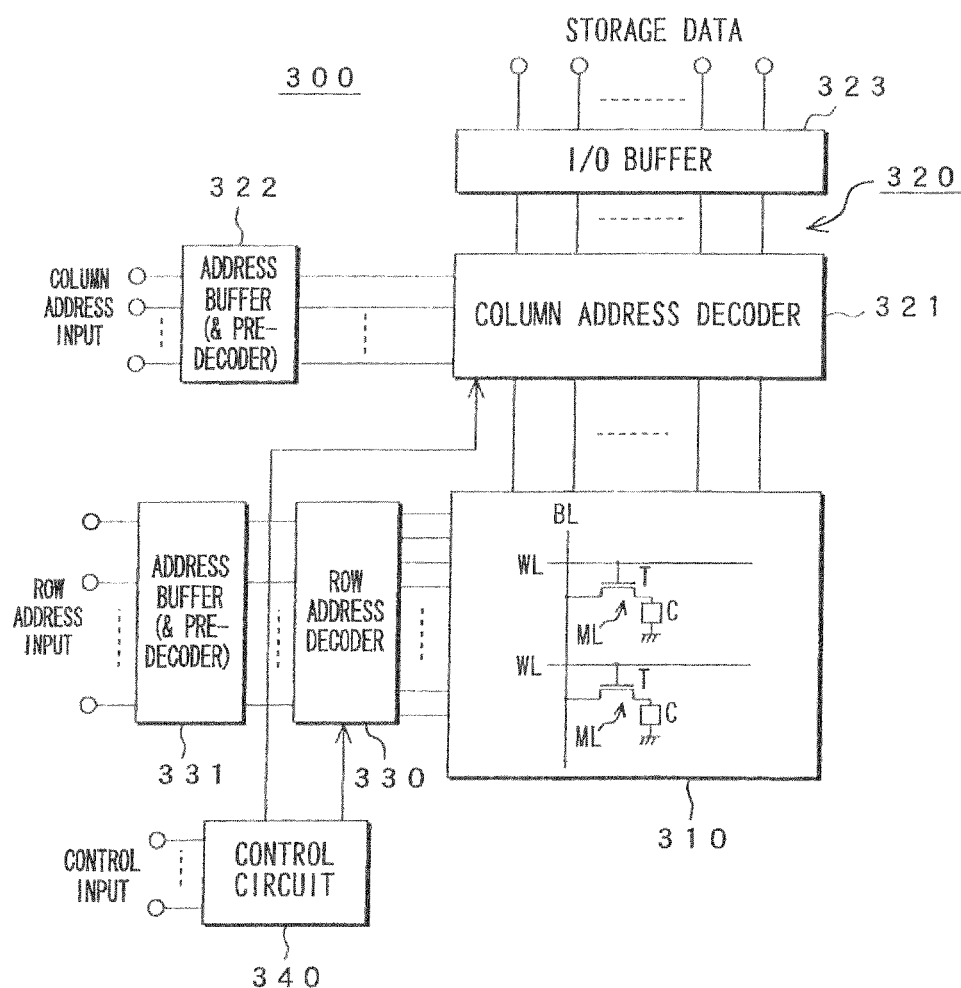
FIG. 1 is a block diagram for showing a configuration of a conventional memory block.
Figure 2:
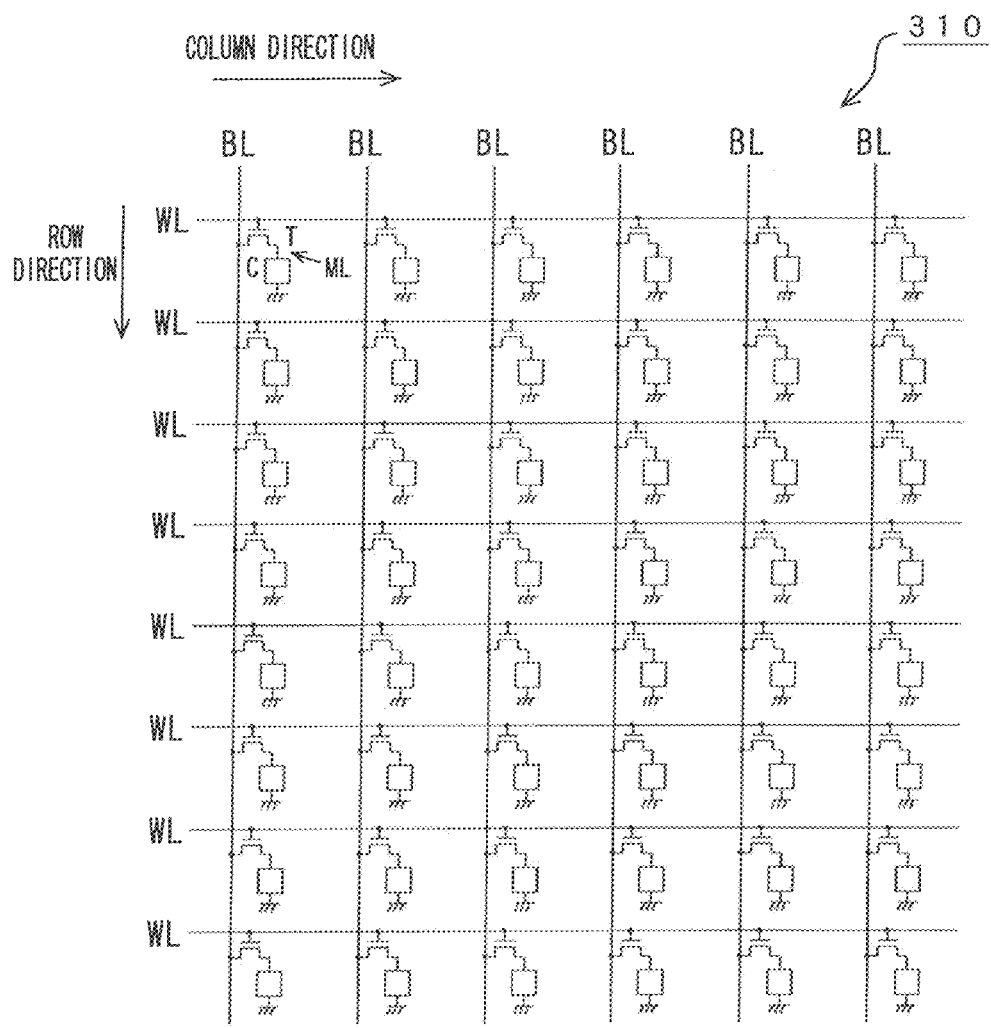
FIG. 2 is a diagram for showing part of a memory cell array in the conventional memory block.
Figure 3:
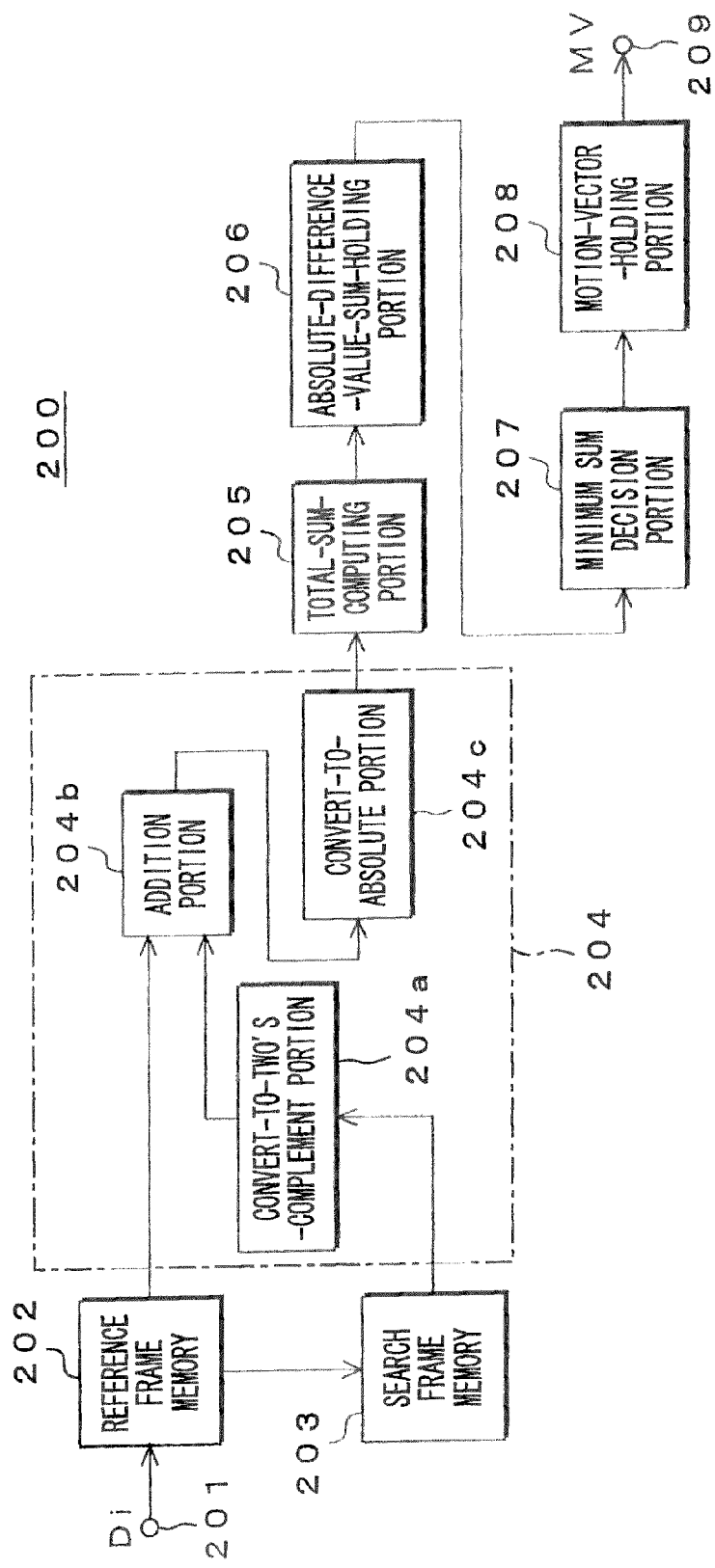
FIG. 3 is a block diagram for showing a configuration of a conventional motion vector detection circuit.
Figure 4:
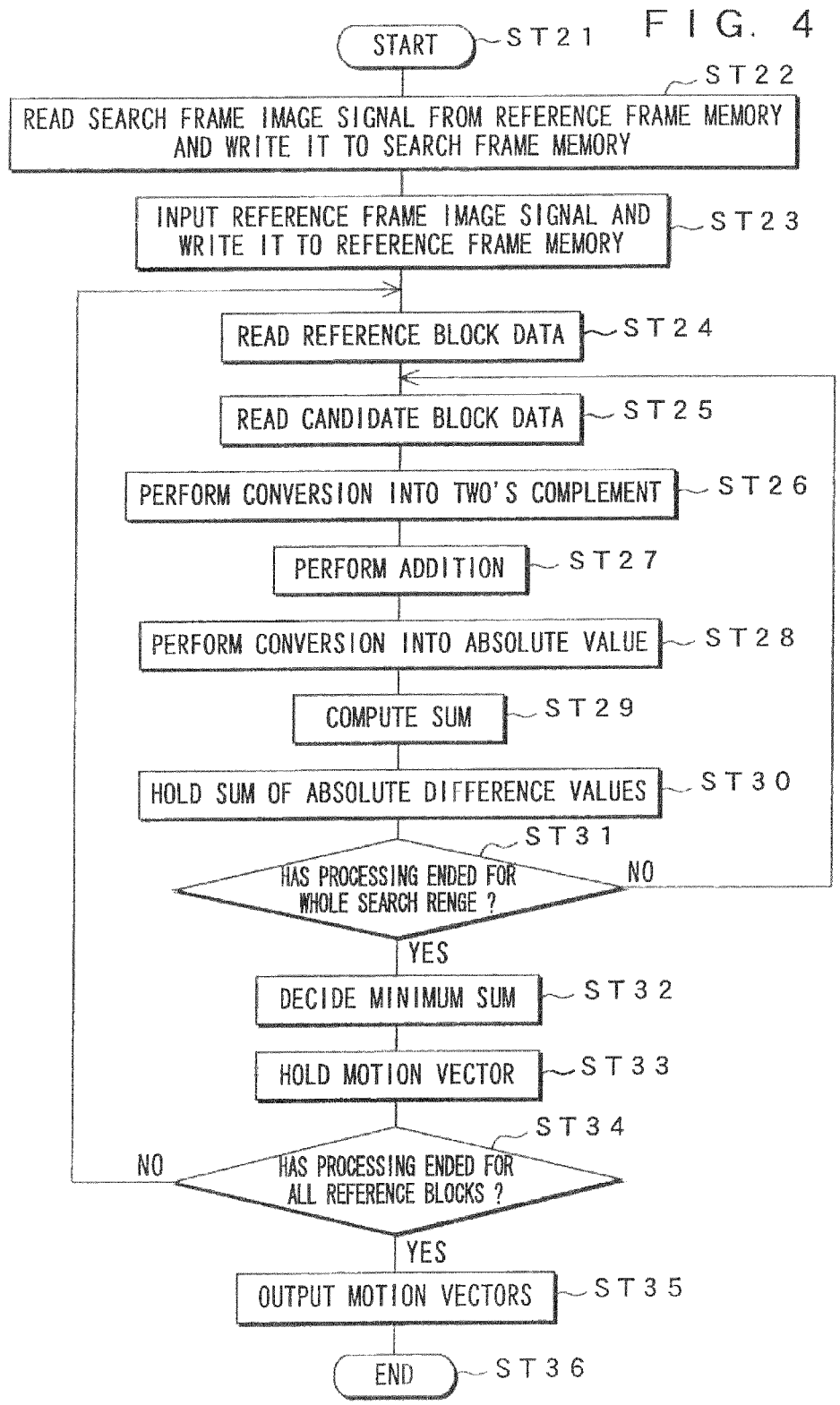
FIG. 4 is a flowchart for showing a conventional processing procedure for detecting a motion vector.
Figure 5:
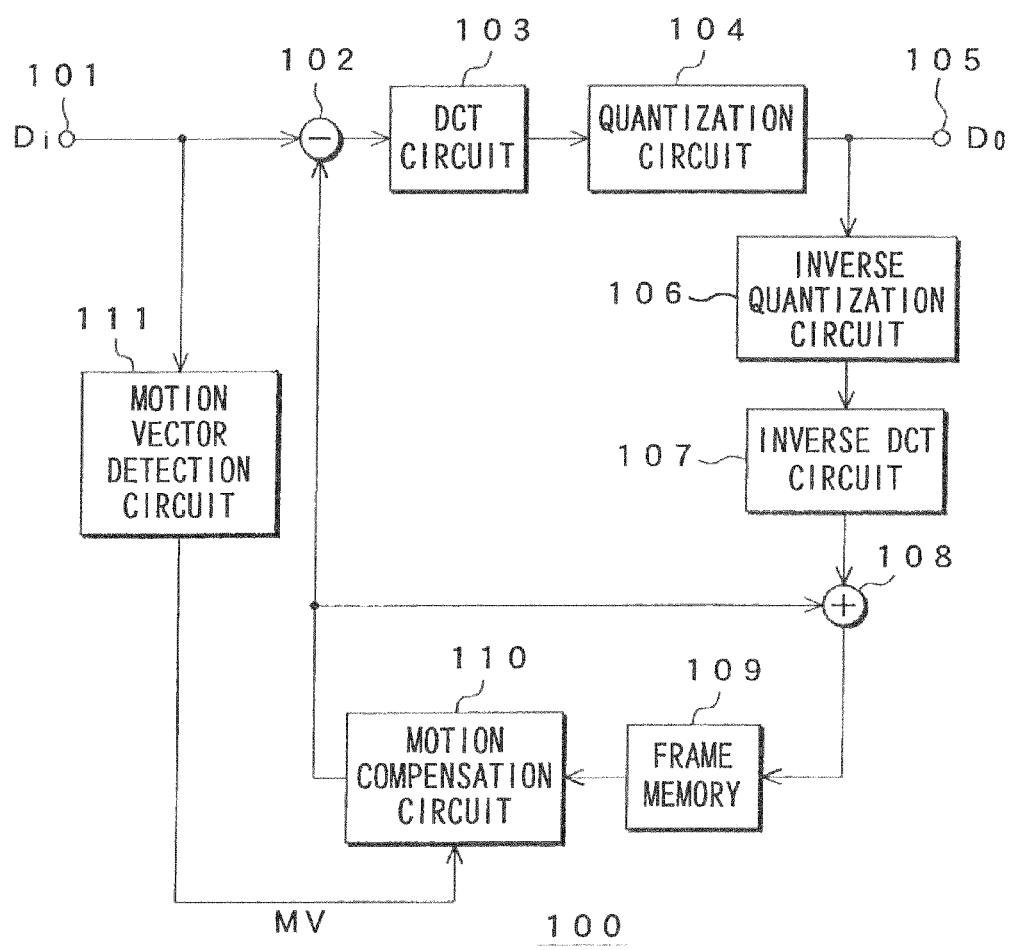
FIG. 5 is a block diagram for showing a motion compensation predictive encoding device according to an embodiment.

FIG. 5 shows a configuration of motion-compensation-predictive-encoding device 100 according to an embodiment. This encoding device 100 has an input terminal 101 to which an image signal Di is input, a subtracter 102 for computing a difference between the image signal Di supplied to this input terminal 101 and a predictive image signal supplied from a later-described motion compensation circuit 110, a DCT circuit 103 for performing discrete cosine transformation (DCT) on a difference signal obtained at this subtracter 102, a quantization circuit 104 for quantizing a DCT coefficient obtained at this DCT circuit 103, and an output terminal 105 for outputting an encoded signal Do obtained at this quantization circuit 104.

The encoding device 100 further has an inverse quantization circuit 106 for inverse-quantizing the encoded signal Do obtained at the quantization circuit 104, an inverse DCT circuit 107 for obtaining a difference signal by performing inverse-DCT on an output signal of this inverse quantization circuit 106, an adder 108 for restoring an original image signal by adding up the difference signal obtained at this inverse DCT circuit 107 and the image predictive signal obtained at the motion compensation circuit 110, and a frame memory 109 for storing the image signal restored by this adder 108.

The encoding device 100 further has the motion compensation circuit 110 for reading the image signal stored in the frame memory 109, motion-compensating this image signal based on a motion vector MV from a later-described motion vector detection circuit 111, and supplying it as a predictive image signal to the subtracter 102 and the adder 108 as described above and the motion vector detection circuit 111 for detecting the motion vector MV of the image signal Di input to the input terminal 101 and supplying it to the motion compensation circuit 110.

The following will describe operations of the motion-compensation-predictive-encoding device 100 shown in FIG. 5.

An image signal Di input to the input terminal 101 is supplied to the subtracter 102 and the motion vector detection circuit 111. The subtracter 102 computes a difference between this image signal Di and a predictive image signal supplied from the motion compensation circuit 110.

The difference signal obtained at the subtracter 102 is supplied to the DCT circuit 103 to undergo discrete cosine transformation. A DCT coefficient obtained at this DCT circuit 103 is supplied to the quantization circuit 104 to be quantized. An encoded signal Do obtained at this quantization circuit 104 is output to the output terminal 105.

Further, the encoded signal Do obtained at the quantization circuit 104 is supplied to the inverse quantization circuit 106 where it is inverse-quantized, and the output signal of the inverse quantization circuit 106 is supplied to the inverse DCT circuit 107 where inverse DCT is performed, to restore the difference signal. This difference signal and the predictive image signal from the motion compensation circuit 110 are added up by the adder 108 to restore the original image signal, which is stored in the frame memory 109.

The motion compensation circuit 110 reads an image signal stored in the frame memory 109 in a frame immediately preceding a certain frame and motion-compensates it based on the motion vector MV from the motion vector detection circuit 111, thereby obtaining a predictive image signal. This predictive image signal is, as described above, supplied to the subtracter 102 so that the difference signal may be obtained and to the adder 108 so that the image signal may be restored.

The following will describe the motion vector detection circuit 111 in detail.

Figure 6:
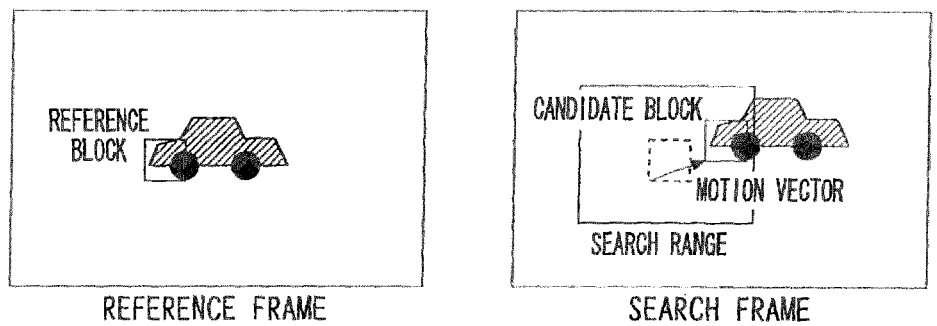
FIG. 6 is a diagram for explaining a block matching.

This motion vector detection circuit 111 detects a motion vector using block matching. More specifically, as shown in FIG. 6, candidate blocks in a search frame in a predetermined search range so that one of these candidate blocks matching a reference block in a reference frame most can be detected, thereby obtaining a motion vector.

Figure 7A:
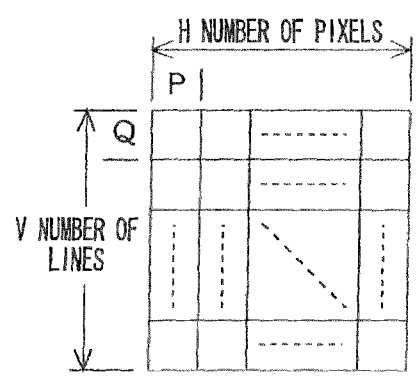
FIGS. 7A and 7B are diagrams each for explaining the block matching.
Figure 7B:
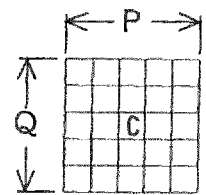

According to the block matching, as shown in FIG. 7A, one image, for example, one-frame image having a size of H number of pixels horizontally by V number of lines vertically is divided into blocks each of which has a size of P number of pixels by Q number of lines as shown in FIG. 7B. In an example of FIG. 7B, P=5 and Q=5. A center pixel position of the block is indicated by c.

FIGS. 8A, 8B, and 8C each shows a positional relationship example of a reference block having center pixel c and a candidate block having center pixel c'. It is supposed that the reference block having center pixel c is targeted in the reference frame and, therefore, such a candidate block in a search frame as to match this reference block has center pixel c'. According to the block matching, a motion vector is detected by finding a candidate block that matches the reference block most in the search range.

In the case of FIG. 8A, a motion vector is detected that has a size of +1 pixel horizontally and +1 line vertically, that is, size (+1, +1). In FIG. 8B a motion vector MV with size (+3, +3) is detected, and in FIG. 8C a motion vector with size (+2, −1) is detected. The motion vector is obtained for each of the reference blocks in the reference frame.

If a motion vector search range is supposed to have a size of ±S number of pixels horizontally by ±T number of lines vertically, it is necessary to compare the reference block to candidate blocks having center pixel c' that is shifted by ±S number of pixels horizontally and ±T number of lines vertically.

FIG. 9 is a diagram for showing a center of a candidate block to be compared to a reference block when the search range is supposed to have a size of ±S number of pixels horizontally and ±T number of lines vertically. In this case, if a certain reference block in the reference frame has center c located at R, it is necessary to compare it to (2S+1)×(2T+1) number of candidate blocks in a comparison-subject search frame. That is, candidate blocks that have center pixel c' in every mesh of FIG. 9 are all subject to comparison. FIG. 9 shows an example where S=4 and T=3.

A motion vector is detected by detecting a minimum sum of the absolute difference values among those obtained by comparison in the search range. A search range of FIG. 9 illustrates a range where centers of the candidate blocks could be located in it and the search range where the entire candidate blocks having a size of P×Q number of pixels is included has a size of (2S+P) by (2T+Q).

FIG. 10 shows a configuration of the motion vector detection circuit 111.

This motion vector detection circuit 111 has an input terminal 121 for inputting the image signal Di as a signal of a reference frame into a memory portion 122 and the memory portion 122 in which this image signal Di of this reference frame and an image signal of a search frame are stored. This memory portion 122 constitutes absolute difference value generation means.

This memory portion 122 uses image signals of a reference frame and a search frame to generate, for each pixel of the reference frame, an absolute difference value between pixel data of this pixel and each of pixel data of a plurality of search positions of the search frame. This memory portion 122 comprises a reference frame memory portion 122a for accumulating the image signal Di of the reference frame, a search frame memory portion 122b for accumulating the image signal of the search frame, and cache memories 122c and 122d.

The cache memories 122c and 122d constitute saving means for temporarily saving, when obtaining an absolute difference value by using storage data of a predetermined line of the frame memory portions 122a and 122b respectively, this storage data of the predetermined lines.

When the image signal Di of a certain frame is supplied from the input terminal 121 into the reference frame memory portion 122a of the memory portion 122 and written into it, an image signal of the immediately preceding frame stored in this reference frame memory portion 122a is read and supplied to the search frame memory portion 122b and written into it.

In this case, eight-bit straight binary format pixel data read from the reference frame memory portion 122a is converted into two's complement format pixel data by a convert-to-two's-complement portion 123 provided outside the memory portion 122 and written into the search frame memory portion 122b as nine-bit pixel data. The two's complement format data is given in nine bits in order to accommodate a representation of "100000000" of two's complement format data corresponding to eight-bit data of "00000000". It is to be noted that the convert-to-two's-complement portion 123 may be provided inside the memory portion 122.

FIG. 11 shows a configuration of a memory block 10 that constitutes the reference frame memory portion 122a and the search frame memory portion 122b.

This memory block 10 has a memory cell array 20, a storage data input/output port 30, a row address decoder 40, an operation data output port 50, and a control circuit 80.

The memory cell array 20 is constituted of a memory cell array portion 20a that corresponds to the reference frame memory portion 122a and a memory cell array portion 20b that corresponds to the search frame memory portion 122b, as shown in FIG. 12.

The memory cell array portion 20a includes a plurality of memory cells ML arranged in a matrix, each of which connected to a bit line BL and word lines WL. Each of the bit lines BL extends in the row direction and transfer data. Each of the word lines WL, on the other hand, extend in the column direction and intersect with each of the plurality of bit lines BL perpendicularly. Similarly, the memory cell array portion 20b includes a plurality of memory cells ML arranged in a matrix, each of which is connected to a bit line BL and word lines WL. Such the memory cells ML, not shown in FIG. 12, constitute a unit A or B, which will be described later.

These memory cell array portions 20a and 20b are formed consecutively in the row direction, in which the bit lines BL extend. It is to be noted that in the memory cell array portions 20a and 20b, the memory cells ML are of, for example, the DRAM structure, so that charges accumulated in capacitors of a plurality of memory cells connected to a plurality of activated word lines WL can be combined along one bit line BL.

Figure 13A:
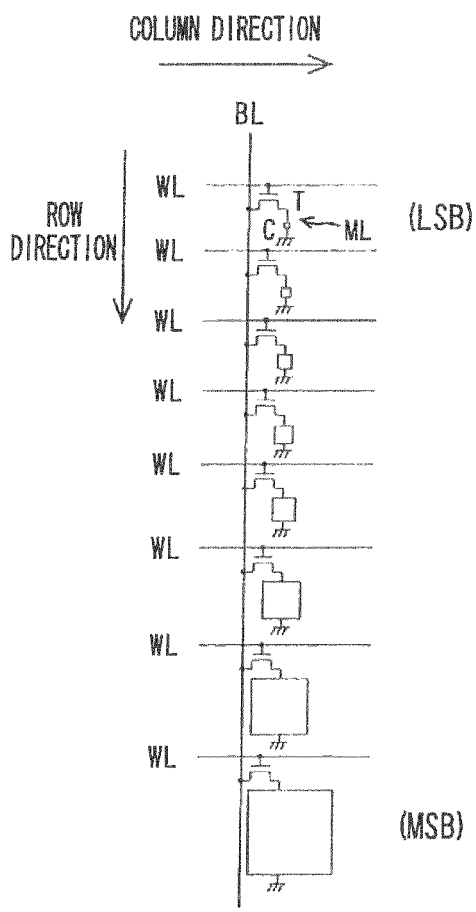
FIGS. 13A and 13B are diagrams each for showing configurations of units A and B, each of which constitutes the memory cell array.

In the memory cell array portion 20a, a plurality of memory cells ML connected to each bit line BL are divided into units A each of which is comprised of eight memory cells, so that one item of pixel data (eight-bit straight binary format data) is stored in each unit A. FIG. 13A shows a configuration of the unit A.

This unit A is connected to eight word lines WL and comprised of eight memory cells ML. The memory cell ML is of the DRAM structure and comprised of an access transistor T and a capacitor C. The capacitor C has its one end grounded and the other end connected via the access transistor T to the bit line BL. The access transistor T has its gate connected to the word line WL. Write and read operations to this memory cell ML are implemented by activating any word lines WL and turning ON the access transistor T thereof as conventionally known.

Each of the eight memory cells ML of this unit A stores each bit of one item of eight-bit data. In this case, capacitors C of the eight memory cells ML are assigned capacitance that corresponds to weight of each bit of this eight-bit data.

In FIG. 13A, the top illustrates the least significant bit (LSB) side and the bottom illustrates the most significant bit (MSB) side. The capacitance of the capacitors C of the eight memory cells ML that constitute the unit A is doubled sequentially from the LSB side to the MSB side. That is, the capacitance of each of the capacitors C of these eight memory cells ML is p, 2p, 4p, 8p, 16p, 32p, 64p, and 128p in this order from the LSB side, assuming that the capacitance of the capacitor C of the LSB is p.

Figure 13B:
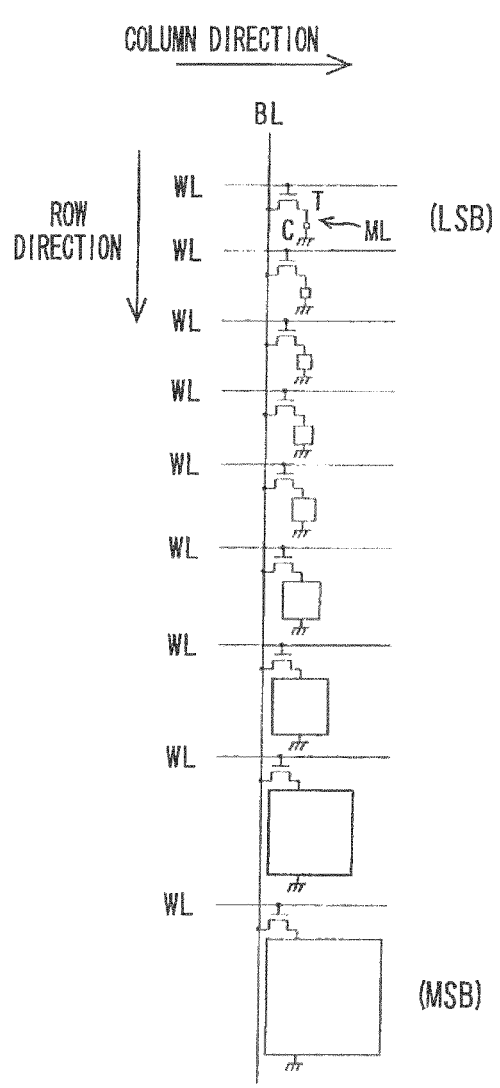

In the memory cell array portion 20, a plurality of memory cells ML connected to each bit line BL is divided into units B each of which is comprised of nine memory cells, so that one item of pixel data (nine-bit two's complement format data) is stored in each unit B. FIG. 13B shows a configuration of the unit B.

This unit B is connected to nine word lines WL and comprised of nine memory cells ML. The memory cell ML is of the DRAM structure and comprised of an access transistor T and a capacitor C. The capacitor C has its one end grounded and the other end connected via the access transistor T to the bit line BL. The access transistor T has its gate connected to the word line WL. Write and read operations to this memory cell ML are implemented by activating any word lines WL and turning ON the access transistor T thereof as conventionally known.

Each of the nine memory cells ML of this unit B stores each bit of one item of nine-bit data. In this case, capacitors C of the nine memory cells ML are assigned capacitance that corresponds to weight of each bit of this nine-bit data.

In FIG. 13B, the top illustrates the LSB side and the bottom illustrates the MSB side. The capacitance of the capacitors C of the nine memory cells ML that constitute unit B is doubled sequentially from the LSB side to the MSB side. That is, the capacitance of each of the capacitors C of these nine memory cells ML is p, 2p, 4p, 8p, 16p, 32p, 64p, 128p, and 256p in this order from the LSB side, assuming that the capacitance of the capacitor C of the LSB is p.

If it is supposed that each frame has H number of lines and each line has W number of pixels, the memory cell array portion 20a has such a structure that units A are arranged at least as many as W in the column direction and at least as many as H in the row direction and the memory cell array portion 20b also has such a structure that units B are arranged at least as many as W in the column direction and at least as many as H in the row direction.

As shown in FIG. 11 again, the storage data input/output port 30 has a column address decoder 31 for storage data, an address buffer 32, and an I/O buffer 33. The column address decoder 31 includes an I/O gate (column switch), a sense-amplifier, etc. The column address decoder 31 is supplied with column addresses via the address buffer 32.

The column address decoder 31 secures its connection with a bit line BL connected to a column directional predetermined memory cell ML in the memory cell array 20 corresponding to the column addresses supplied via the address buffer 32, thereby enabling storage data write and read operations to this column directional predetermined memory cell ML via the I/O buffer 33 and the column address decoder 31.

The row address decoder 40 is supplied with row addresses via an address buffer 41. The row address decoder 40 activates a word line WL connected to a row directional predetermined memory cell ML in the memory cell array 20 corresponding to the row addresses supplied via the address buffer 41, thereby enabling storage data write and read operations to this row directional predetermined memory cell ML via the I/O buffer 33 and the column address decoder 31.

Further, the operation data output port 50 has a column address decoder 51 for outputting operation data, an address buffer 52, and an A/D converter 53. The column address decoder 51 includes an I/O gate (column switch), a sense-amplifier, etc. The column address decoder 51 is supplied with column addresses via the address buffer 52. The column address decoder 51 constitutes bit line selection means. Further, the column address decoder 51 and the A/D converter 53 constitute signal output means.

The column address decoder 51 secures its connection with one bit line BL connected to a column directional predetermined memory cell ML in the memory cell array 20 corresponding to the column addresses supplied via the address buffer 52, thereby outputting a voltage signal having a value that corresponds to a total amount of charges obtained along that one bit line BL. The A/D converter 53 converts the voltage signal (analog signal) output from the column address decoder 51 into a digital signal having a predetermined number of bits, for example, eight bits and outputs it.

Further, the control circuit 80 controls operations of the above-described circuits of the memory block 10 based on a control input.

The following will describe operations of the memory block 10 shown in FIG. 11.

In this memory block 10, storage data write and read operations can be performed to a predetermined memory cell ML only at portions in the memory cell array 20 other than the operation data output port 50.

That is, the column address decoder 31 is supplied with column addresses via the address buffer 32. Corresponding to the column addresses, the column address decoder 31 secures its connection with a bit line BL connected to a column directional predetermined memory cell ML in the memory cell array 20. The row address decoder 40, on the other hand, is supplied with row addresses via the address buffer 41. The row address decoder 40 activates any word line WL connected to a row directional predetermined memory cell ML in the memory cell array 20 corresponding to the row addresses. Accordingly, storage data write and read operations are performed to the column directional and row directional predetermined memory cells ML through the I/O buffer 33 and the column address decoder 31.

The following will describe an operation of outputting an absolute difference value using the operation data output port 50. In eight memory cells ML of each unit A in the memory cell array portion 20a of the memory cell array 20, bits of eight-bit straight binary format pixel data are stored respectively as described above. In nine memory cells ML of each unit B in the memory cell array portion 20b of the memory cell array 20, on the other hand, bits of nine-bit two's complement format pixel data are stored respectively as described above.

The row address decoder 40 is supplied with row addresses via the address buffer 41. In response to the row addresses, the row address decoder 40 simultaneously activates pixel data of one line in each of the memory cell array portions 20a and 20b of the memory cell array 20, that is, a plurality of word lines WL related to units of each row. With this, charges accumulated in the capacitors C of a plurality of memory cells ML connected to the plurality of activated word lines WL related to the two items of pixel data are combined along each bit line BL.

If it is supposed that total capacitance of the capacitors C of the plurality of memory cells ML is Cm, a total amount of the charges accumulated there is Qc, and capacitance of the bit line BL is Cb, a total amount of charges Qb along the bit line is given in the following equation. That is, the total amount of charges Qb along the bit line is proportional to the total amount of charge Qc accumulated in the capacitors C of the plurality of memory cells ML.

$$Qb = Qc \times Cb/(Cm+Cb) \qquad \text{Equation (1)}$$

In this condition, the column address decoder 51 is supplied with column addresses via the address buffer 52. Corresponding to the column addresses, the column address decoder 51 secures its connection with one bit line BL connected to a column directional predetermined memory cell ML in the memory cell array 20. Accordingly, a voltage signal having a value that corresponds to a total amount of charges obtained along the bit line BL to which the connection is secured is output from the column address decoder 51. Therefore, the A/D converter 53 provides a digital signal having a value that corresponds to the total amount of charges obtained along the bit line BL to which that connection is secured.

As described above, pixel data constituting the image signal Di of a reference frame is stored in its straight binary format in each unit A in the memory cell array portion 20a and pixel data constituting the image signal of a search frame is stored in its two's complement format in each unit B in the memory cell array portion 20b. Therefore, a total amount of charges obtained along each bit line BL corresponds to a difference value between the pixel data of the reference frame and that of the search frame. Further, although not described above, the A/D converter 53 performs conversion from an analog signal to a digital signal as well as conversion into an absolute value. Therefore, as described above, a digital signal obtained from the A/D converter 53 provides an absolute difference value obtained by converting the difference data obtained by subtracting pixel data of a search frame from that of a reference frame into an absolute value.

In this case, by sequentially changing one bit line BL to which connection is secured by the column address decoder 51, an absolute difference value that corresponds to each of the bit lines BL is obtained sequentially from the A/D converter 53. That is, an absolute difference value of one line is sequentially obtained between a predetermined line of the reference frame and a predetermined line of the search frame.

Figure 14:
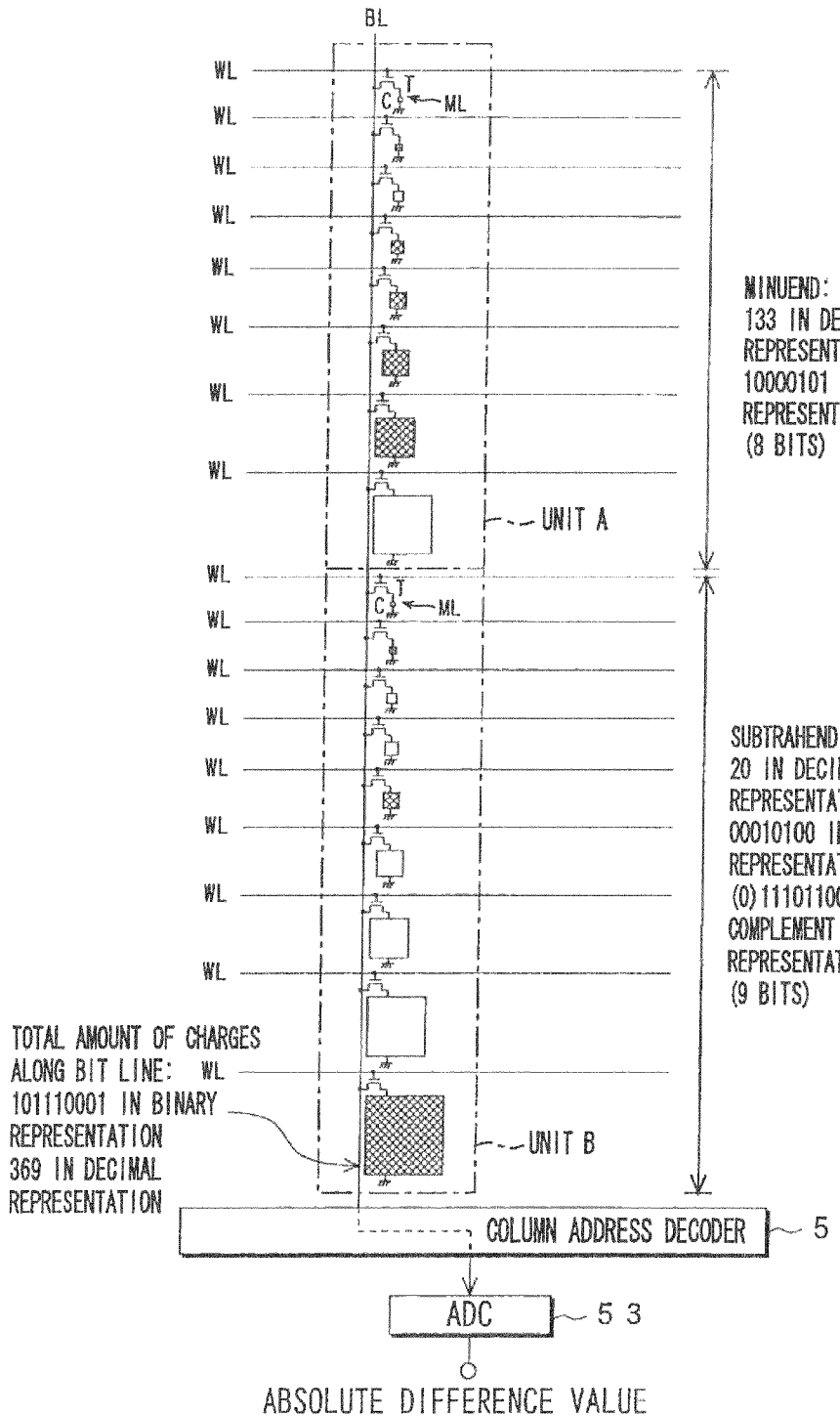
FIG. 14 is a diagram for explaining a specific example of subtraction.

The following will describe a specific example of subtraction with reference to FIG. 14. In this specific example, eight-bit subtrahend data is subtracted from eight-bit minuend data. In unit A, the eight-bit minuend data is stored as it is in straight binary format. This eight-bit data is "10000101" in binary representation and "133" in decimal representation. In unit B, on the other hand, the eight-bit subtrahend data is converted into nine-bit two's complement format data and stored. This eight-bit data is "00010100" in binary representation and "20" in decimal representation. Further, the nine-bit data after being converted into two's complement format is "011101100".

Since the minuend data and the subtrahend data are stored in units A and B respectively, a charge is accumulated only in unhatched capacitors C of memory cells ML of these units A and B. In this case, a total amount of charges accumulated in all of the capacitors C of the eight memory cells ML of unit A is 133q, assuming that a charge accumulated in the capacitor C of the LSB memory cell ML is q. Similarly, the total amount of charges accumulated in all of the capacitors C of the nine memory cells ML of unit B is 236q.

When, in this condition, a plurality of word lines WL related to the two units A and B is activated simultaneously and the access transistors T of the memory cells ML are turned ON, the charges accumulated in the units A and B are combined along the bit line BL. With this, a total amount of the charges combined along the bit line BL corresponds to "369" in decimal representation. That is, from the above Equation (1), the total amount of charges along the bit line $Qb=369q \times Cb/(Cm+Cb)$.

Therefore, a voltage signal having a value that corresponds to this total amount of charges "369" is output from the column address decoder 51. It is to be noted that "369" is "101110001" in binary representation. In this case, the MSB is a sign bit, indicating a positive sign when it is "1" and a negative sign when it is "0". Therefore, the A/D converter 53 performs A/D conversion taking into account this sign bit, so that an absolute difference value between items of data stored in the two units A and B, respectively, is obtained.

Figure 15:
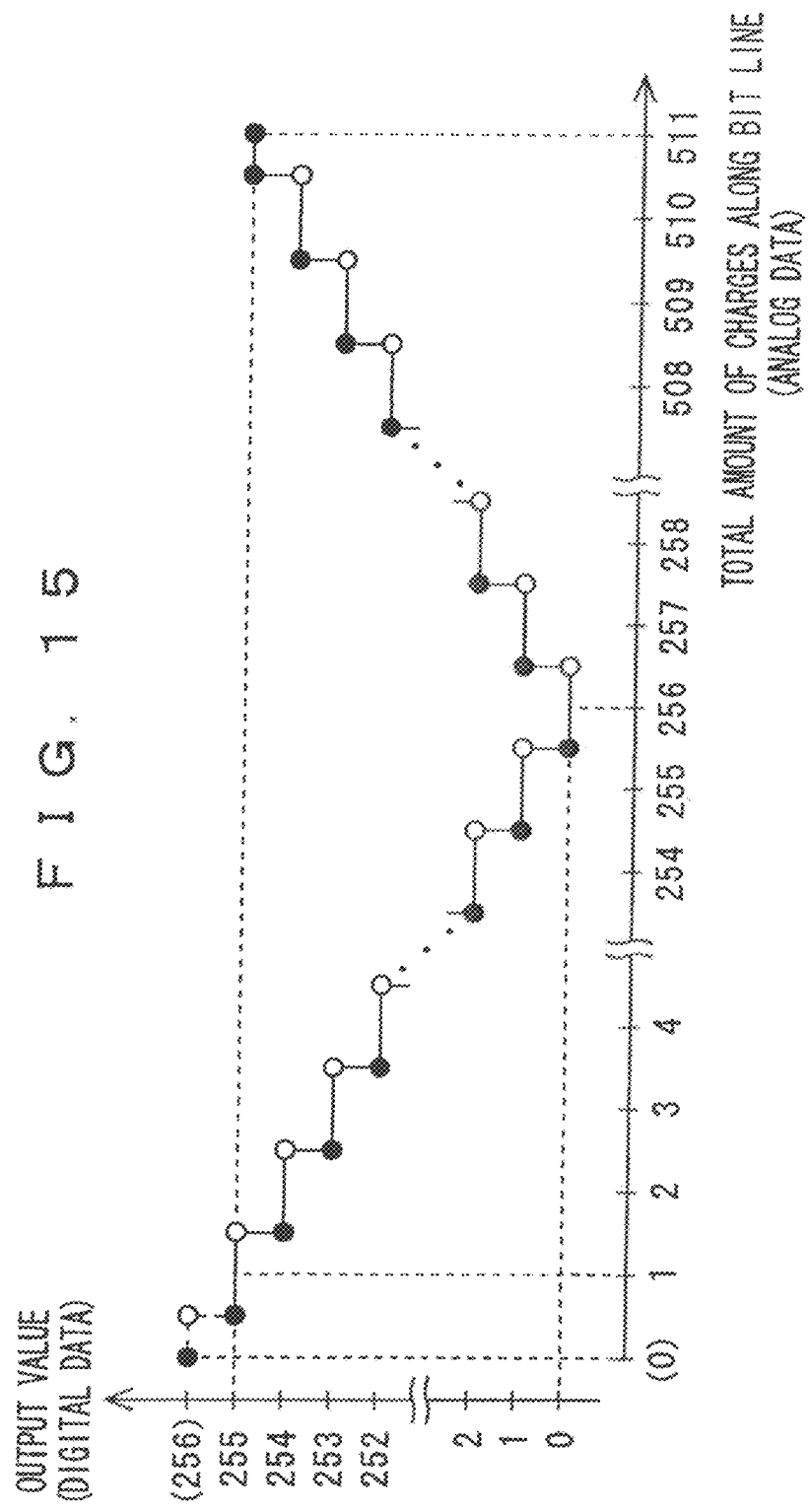
FIG. 15 is a diagram for showing a relationship between a total amount of charges along each bit line and an output value (in the case of subtraction, the value is converted into an absolute value)

FIG. 15 shows a relationship between a total amount of charges along each bit line and an output value of the A/D converter 53. In this case, corresponding to charge amounts along the bit line of "1" through "255" and "256" through "511", digital signals of "255" through "1" and "0" through "255" are output, respectively. The total amount of charges along the bit line given along a horizontal axis of FIG. 15 is normalized so that $q \times Cb/(Cm+Cb)$ may be 1. The total amount of charges along the bit line given along a horizontal axis of each of FIGS. 16 and 24, which will be described later, is also normalized similarly.

Figure 16:
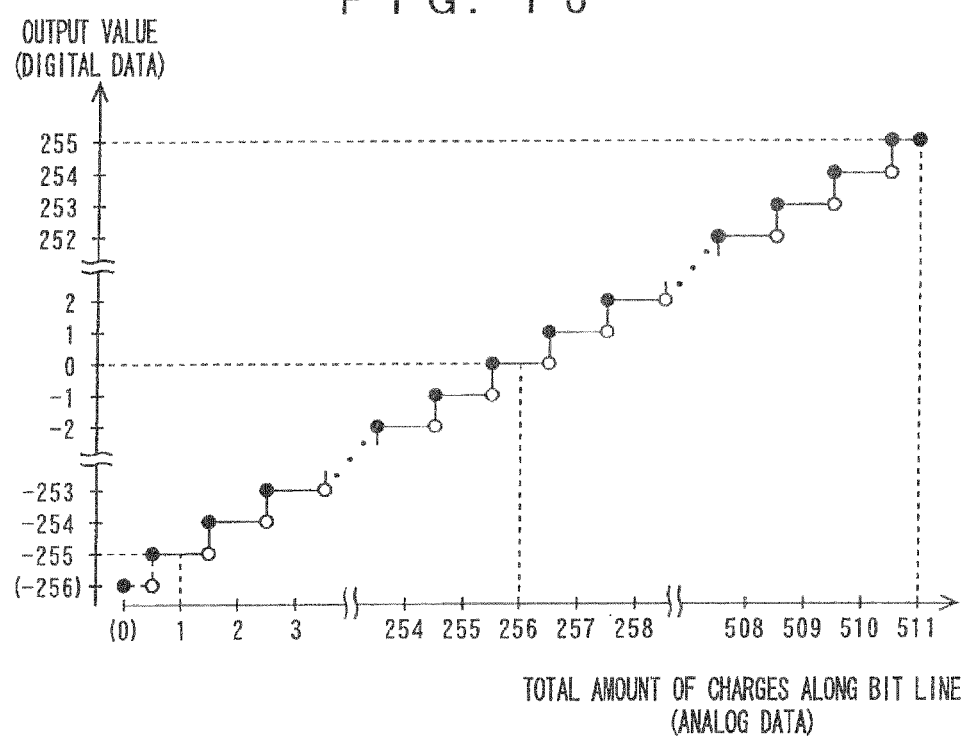
FIG. 16 further shows a relationship between a total amount of charges along each bit line and an output value (in the case of subtraction, the value is not converted into an absolute value)

It may be considered also that the relationship between the total amount of charges along the bit line and the output value of the A/D converter 53 is set as shown in FIG. 16 to obtain difference data from this A/D converter 53 and convert this difference data into an absolute value using a separate convert-to-absolute circuit. In this case, the A/D converter 53 outputs a digital signal of "−255" through "255" corresponding to a total amount of charges along bit line of "1" through "511".

It is to be noted that eight-bit minuend data can take on a value of "0" through "255" in decimal representation, while eight-bit subtrahend data can also take on a value of "0" through "255" in decimal representation. In this case, if the minuend data and the subtrahend data are stored in units A and B properly and a plurality of word lines WL related to these units A and B is activated simultaneously, the total amount of charges along the bit line takes on a value of "1" through "511" in decimal representation and cannot take on a value of "0". Therefore, although conversion is performed even in a case where the total amount of charges along the bit line is "0" in FIGS. 15 and 16, its digital value itself after being converted does not have meaning in particular.

As described above, in this memory cell block 10, by simultaneously activating a plurality of word lines WL related to pixel data of one line of each of the memory cell array portions 20a and 20b that constitute the memory cell array 20, it is possible to obtain an absolute difference value of one line between a predetermined line of a reference frame and a predetermined line of a search frame.

In this case, by changing a position of the line to be activated in the memory cell array portion 20b with respect to the line to be activated in the memory cell array portion 20a, it is possible to obtain an absolute difference value between pixel data of the predetermined line of the reference frame and that of the line of the search frame that is shifted by a predetermined number of lines vertically (in the row direction).

It is to be noted that if a plurality of word lines WL related to pixel data of one line of each of the memory cell array portions 20a and 20b is activated simultaneously, charges accumulated in the capacitors C of the plurality of memory cells ML connected to these word lines WL are combined along the bit line BL and output as described above. Therefore, after the accumulated charges are combined, data stored in this plurality of memory cells ML is rendered meaningless (destroyed).

Therefore, pixel data of one line stored in a plurality of memory cells ML in the memory cell arrays portions 20a and 20b corresponding to word lines WL to be activated is saved in the cache memories 122c and 122d respectively before the word lines WL are activated (see FIG. 10). Then, as described above, after an absolute difference value of one line is obtained from the A/D converter 53, the data saved in these cache memories 122c and 122d is used to restore the meaningless data in the plurality of memory cells ML to the original state.

Further, by moving a position of pixel data stored in the memory cell array portion 20a or 20b horizontally (in the column direction), it is possible to obtain an absolute difference value between pixel data of a predetermined pixel in a reference frame and that of a pixel in a search frame at a position shifted from that by a predetermined number of pixels horizontally.

It is to be noted that when moving the position of pixel data stored in the memory cell array portion 20a or 20b horizontally (in the column direction), the above-described cache memories 122c and 122d are used as a temporary storage memory.

The memory portion 122, in the above-described configuration, uses image signals of a reference frame and a search frame to generate, for each pixel of the reference frame, an absolute difference value between pixel data of that pixel and pixel data of each of the plural search positions of the search frame.

It is here supposed that one frame of image has a size of W×H number of pixels. It is further supposed that the search range has a horizontal size of sw number of pixels (+xa through −xb in this case) and a vertical size of sh number of pixels (+ya through −yb in this case). In this case, as shown in FIG. 17, for each of the W×H number of pixels of the reference frame, an absolute difference value is generated between pixel data of that pixel and pixel data of each of the sw×sh number of search positions of the search frame.

Figure 17:
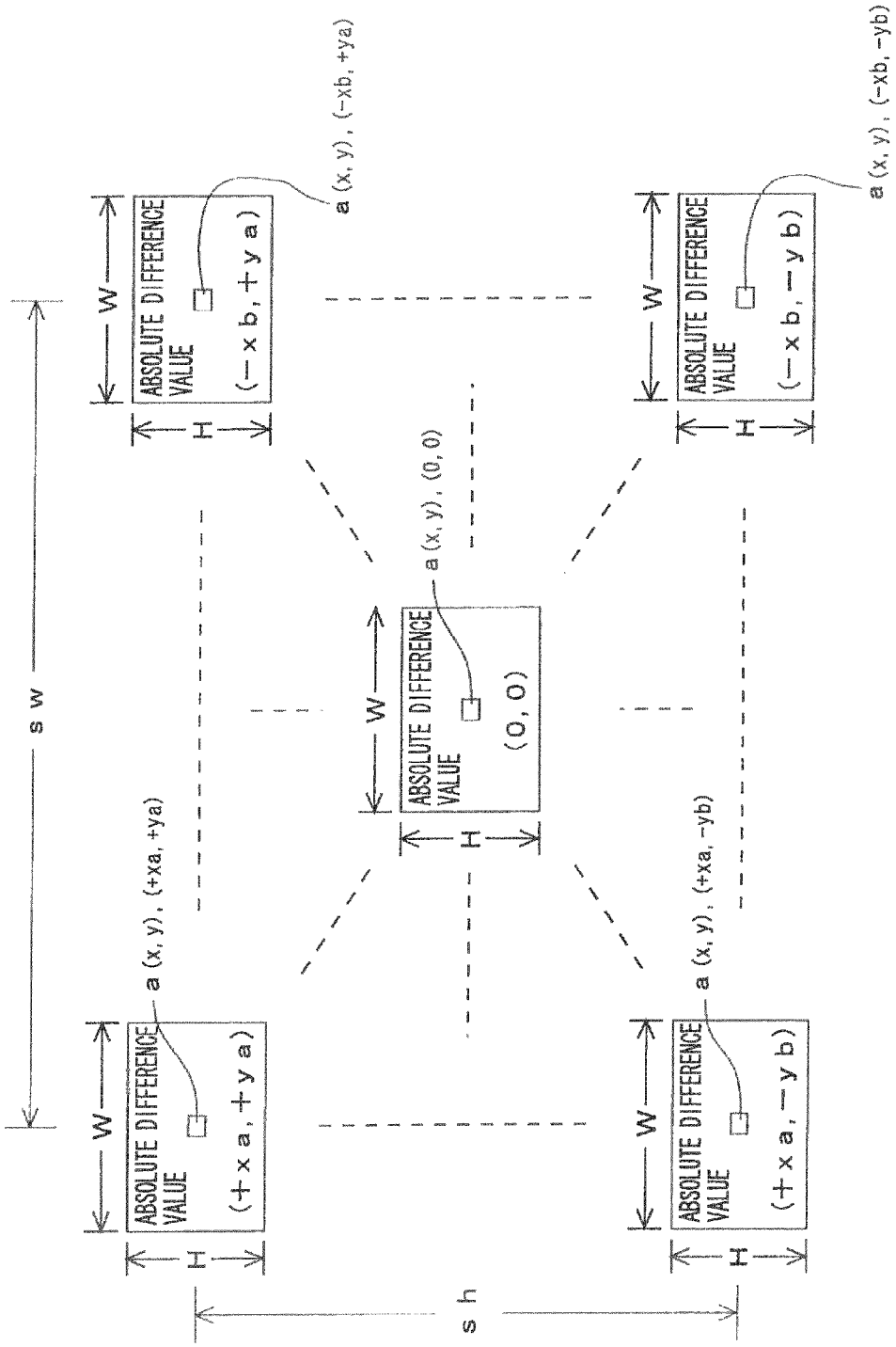
FIG. 17 is a diagram for explaining how an absolute difference value is generated.

In FIG. 17, absolute difference value a (x, y), (0, 0) indicates an absolute difference value between pixel data of a pixel at position (x, y) in the reference frame and pixel data of a pixel at position (x, y) in the search frame; similarly, absolute difference values a (x, y), (+xa, +ya); a (x, y), (−xb, +ya); a (x, y), (+xa, −yb); and a (x, y), (−xb, −yb) indicate absolute each of the difference values between the pixel data of a pixel at position (x, y) in the reference frame and pixel data of each of the pixels at positions (x+xa, y+ya), (x−xb, y+ya), (x+xa, y−yb), and (x−xb, y−yb) in the search frame.

Figure 18:
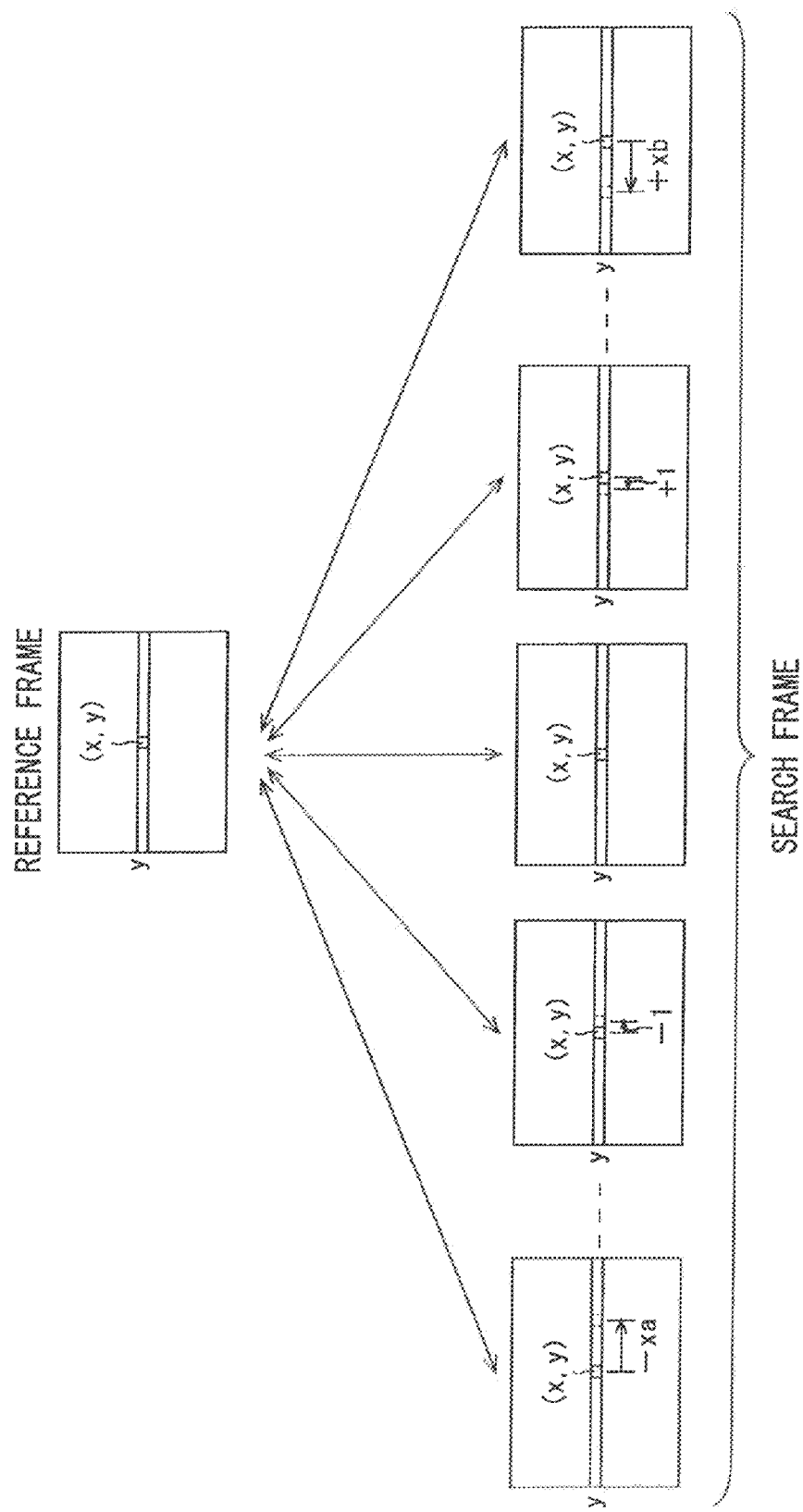
FIG. 18 is a diagram for explaining difference calculation processing.

It is to be noted that absolute difference values between the pixel data of the pixel at position (x, y) in the reference frame and pixel data of each of the pixels at positions (x+xa, y) through (x−xb, y) can be obtained by moving a storage position of the pixel data of position (x, y) in the search frame stored in, for example, the memory cell array portion 20b by as much as −xa through +xb horizontally (in the column direction) as shown in FIG. 18.

Figure 19:
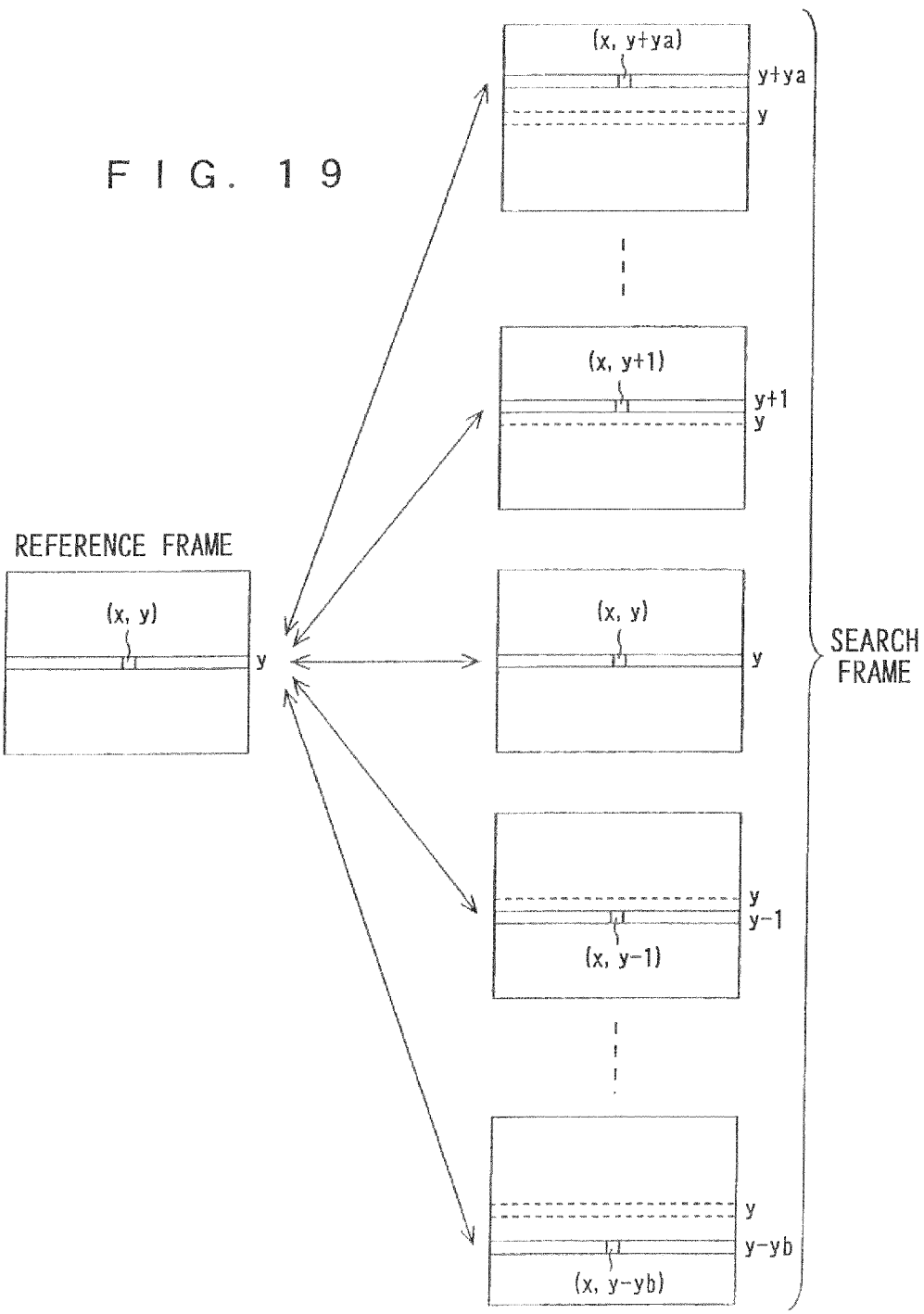
FIG. 19 is a diagram for explaining another difference calculation processing.

Similarly, absolute difference values between the pixel data of the pixel at position (x, y) in the reference frame and pixel data of each of the pixels at positions (x, y+ya) through (x, y−yb) can be obtained by changing the position of line activated in the memory cell array portion 20b to y+ya through y−yb as shown in FIG. 19.

As shown in FIG. 10 again, the motion vector detection circuit 111 has an absolute-difference-value-holding portion 124 for holding an absolute difference value generated by the memory portion 122. This absolute-difference-value-holding portion 124 constitutes the absolute difference value sum generation means.

This absolute-difference-value-holding portion 124 uses an absolute difference value generated by the memory portion 122 to generate, for each reference block in a reference frame, a sum of absolute difference values between this reference block and each of the sw×sh number of candidate blocks in a search range of a search frame corresponding to this reference block.

FIG. 20 shows a configuration of a memory block 60 that constitutes the absolute-difference-value-holding portion 124. This memory block 60 has a memory cell array 70, the storage data input/output port 30, the row address decoder 40, the operation data output port 50, and the control circuit 80.

This memory block 60 is configured the same way as the z above-described memory block 10 (see FIG. 11) that constitutes the reference frame memory portion 122a and the search frame memory portion 122b except the memory cell array 70. Therefore, the following will describe the memory cell array 70 in detail, omitting the other components appropriately.

The memory cell array 70, as shown in FIG. 21, is comprised of a plurality of memory cells ML each connected to a bit line BL and word lines WL and arranged in a matrix. The memory cell ML, which is not shown in FIG. 21, constitutes unit A, which will be described later. It is to be noted that in the memory cell array 70, the memory cells Ml are of, for example, the DRAM structure, so that charges accumulated in capacitors C of a plurality of memory cells ML connected to a plurality of activated word lines WL can be combined along one bit line BL.

In the memory cell array 70, a plurality of memory cells ML connected to each bit line BL is divided into units A each of which includes eight memory cells, so that one absolute difference value (eight-bit straight binary format data) is stored in each unit A. Unit A has such a configuration as shown in FIG. 13A as described above.

If each frame of image has a size of W×H number of pixels and a search range has a horizontal size of sw number of pixels and a vertical size of sh number of pixels, the memory cell array 70 has such a configuration that at least sw×sh number of units A are arranged in a column direction and at least W×H number of units A are arranged in a row direction, as described above.

As described above, the memory portion 122 generates, for each of the W×H number of pixels of a reference frame, an absolute difference value between pixel data of each of the pixels and pixel data of each of the sw×sh number of search positions of a search frame. In the above-described memory cell array 70, as shown in FIG. 22, a row directional position of each unit A corresponds to a position of each of the W×H number of pixels of the reference frame and a column directional position of each unit A corresponds to a position of each of the sw×sh number of search positions of the search frame. Each unit A in this memory cell array 70 holds the corresponding absolute difference value. For example, a row of the sw×sh number of units A corresponding to a row directional position (x, y) holds absolute difference values between pixel data of pixels at position (x, y) in the reference frame and pixel data of the sw×sh number of search positions in a range having a horizontal size of x+xa through x−xb and a vertical size of y+ya through y−yb in the search frame.

The following will describe operations of the memory block 60 shown in FIG. 20.

In this memory block 60, operations for writing or reading storage data to or from a predetermined memory cell ML can be performed only at portions in the memory block other than the operation data output port 50.

That is, the column address decoder 31 is supplied with column addresses via the address buffer 32. Corresponding to the column addresses, the column address decoder 31 secures its connection with a bit line BL connected to a column directional predetermined memory cell ML in the memory cell array 70.

The row address decoder 40, on the other hand, is supplied with row addresses via the address buffer 41. The row address decoder 40 activates word lines WL connected to a row directional predetermined memory cell ML in the memory cell array 70 corresponding to the row addresses. Accordingly, the operations for writing or reading storage data are performed to the column directional and row directional predetermined memory cells ML through the I/O buffer 33 and the column address decoder 31.

The following will describe an operation of outputting a sum of absolute difference values using the operation data output port 50.

The row address decoder 40 is supplied with row addresses via the address buffer 41. In response to the row addresses, the row address decoder 40 simultaneously activates a plurality of word lines WL related to row directional units A corresponding to positions of bw×bh number of pixels in a predetermined reference block in the memory cell array 70 (see FIG. 22). In this case, bw indicates the horizontal number of pixels in the reference block and bh indicates the vertical number of pixels in the reference block. With this, charges accumulated in capacitors C of a plurality of memory cells ML connected to the plurality of activated word lines WL related to the bw×bh number of units A are combined along each bit line BL.

In this condition, the column address decoder 51 is supplied with column addresses via the address buffer 52. Corresponding to the column addresses, the column address decoder 51 secures its connection with one bit line BL connected to a column directional predetermined memory cell ML in the memory cell array 70. Accordingly, a voltage signal having a value that corresponds to a total amount of charges obtained along the bit line BL to which the connection is secured is output from the column address decoder 51. Therefore, the A/D converter 53 provides a digital signal having a value that corresponds to the total amount of charges obtained along the bit line BL to which that connection is secured.

As described above, in the memory cell array 70, the plurality of word lines WL is simultaneously activated that is related to the row directional units A that correspond to positions of bw×bh number of pixels in a predetermined reference block. Therefore, a total amount of charges obtained along each bit line BL corresponds to a result of adding up the bw×bh number of absolute difference values between the predetermined reference block and each of the predetermined candidate blocks in a search range of a search frame corresponding to this predetermined reference block. Therefore, a sum of absolute difference values (digital signal) that indicates the added up result is obtained from the A/D converter 53.

In this case, by sequentially changing one bit line BL to which connection is secured by the column address decoder 51, a sum of absolute difference values between the predetermined reference block and each of the sw×sh number of candidate blocks in the search range of the search frame corresponding to this predetermined reference block is obtained sequentially from the A/D converter 53. Further, sums of absolute difference values related to other reference blocks are also obtained by causing a plurality of word lines WL which is to be activated and is related to row directional units A corresponding to bw×bh number of pixel positions in the memory cell array 70 to correspond to other reference blocks.

Figure 23:
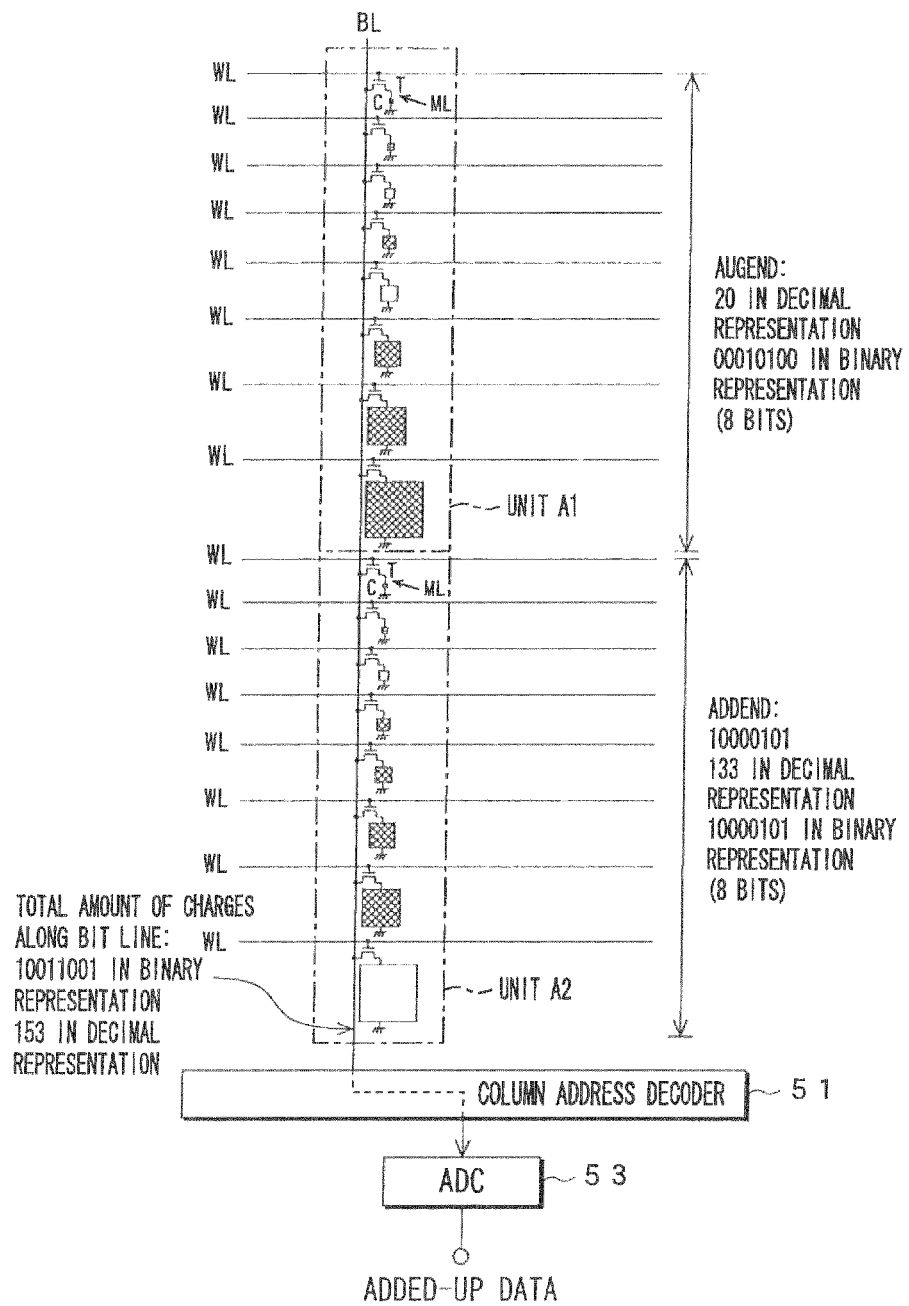
FIG. 23 is a diagram for explaining a specific example of addition.

The following will describe a specific example of addition with reference to FIG. 23. In this specific example, two items of eight-bit data are added up for simplification of the description.

In unit A1, eight-bit data is stored as augend data. This eight-bit data is "00010100" in binary representation and "20" in decimal representation. In unit A2, on the other hand, eight-bit data is stored as addend data. This eight-bit data is "10000101" in binary representation and "133" in decimal representation.

Since the augend data and the addend data are stored in units A1 and A2 respectively, a charge is accumulated only in unhatched capacitors C of memory cells ML of these units A1 and A2. In this case, a total amount of charges accumulated in all of the capacitors C of the eight memory cells ML of unit A1 is 20q, assuming that a charge accumulated in the capacitor C of the LSB memory cell ML is q. Similarly, the total amount of charges accumulated in all of the capacitors C of the eight memory cells ML of unit A2 is 133q.

When, in this condition, a plurality of word lines WL related to units A1 and A2 is activated simultaneously and the access transistors T of the memory cells ML are turned ON, the charges accumulated in the units A1 and A2 are combined along the bit line BL. With this, a total amount of the charges combined along the bit line BL corresponds to "153" in decimal representation.

Therefore, a voltage signal having a value that corresponds to this total amount of charges "153" is output from the column address decoder 51. With this, added-up data that corresponds to a result of adding up items of data stored in units A1 and A2 respectively is obtained from the A/D converter 53.

Since units A1 and A2 are of eight-bit output, their added-up data has a nine-bit value. Therefore, by using a nine-bit quality A/D converter, the added-up data can be output at an accuracy of values as stored in units A1 and A2.

Figure 24:
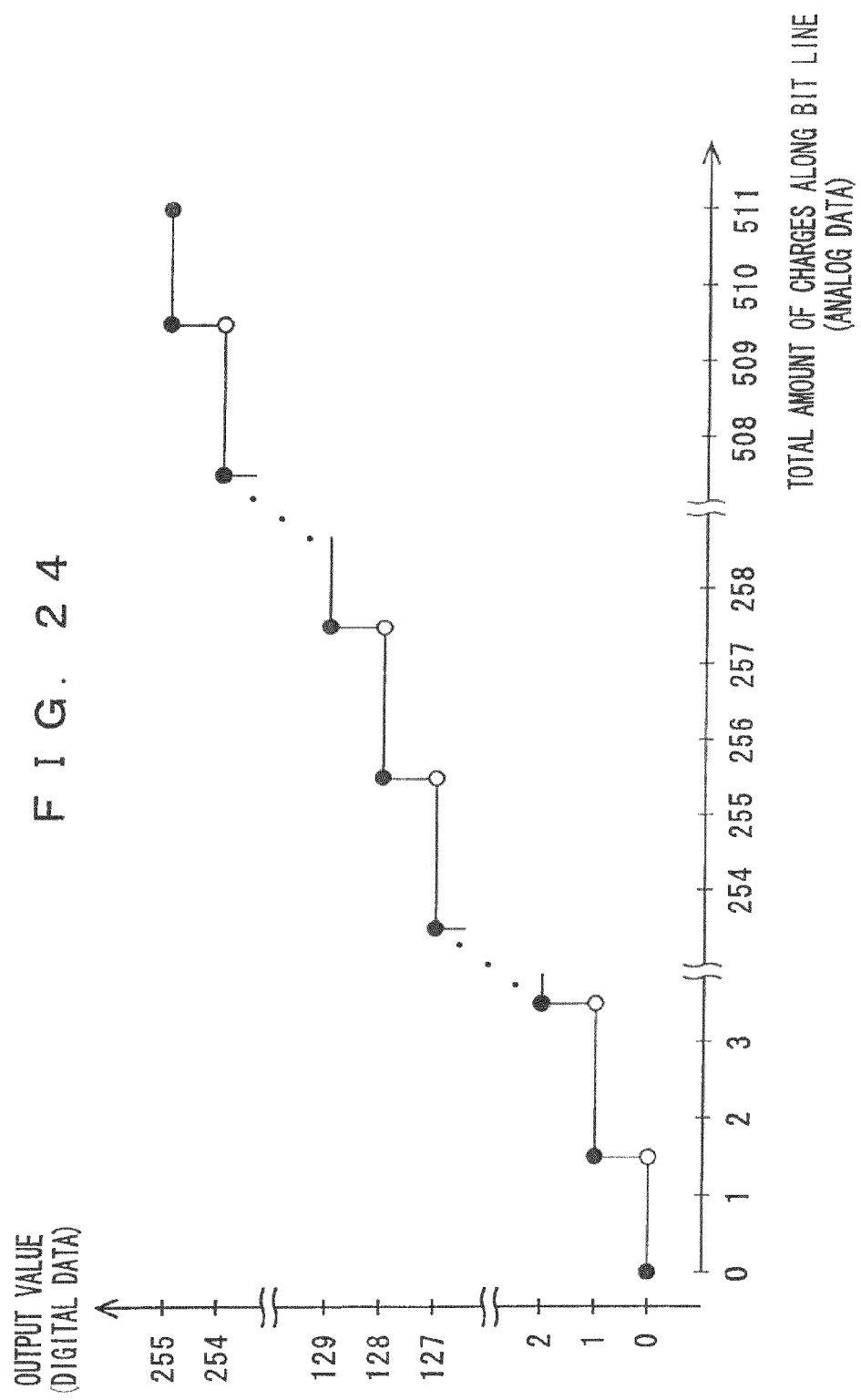
FIG. 24 is a diagram for showing a relationship between a total amount of charges along each bit line and an output value (in the case of addition)

Further, an eight-bit A/D converter can be utilized. In this case, eight-bit output is provided, so that an output value has a lower accuracy. FIG. 24 shows a relationship between a total amount of charges along each bit line and an output value (added-up data) of the eight-bit A/D converter 53. In the case of FIG. 24, the number of tones can be converted from 512 to 256 through such conversion characteristics. Since the number of tones is changed from 512 to 256, a value twice its output value provides an actual added up result.

It is to be noted that if a plurality of word lines WL related to row directional units A that correspond to the bw×bh number of pixel positions in a predetermined reference block in the memory cell array 70 is activated simultaneously, charges accumulated in capacitors C of a plurality of memory cells ML connected to these word lines WL are combined along a bit line BL as described above. Therefore, after the charges are combined, data stored in this plurality of memory cells ML is rendered meaningless. However, data stored in this plurality of memory cells ML is not required to obtain a sum of absolute difference values related to any other reference block that has a different pixel position from this predetermined reference block, so that it is unnecessary to save this data stored in this plurality of memory cells ML in, for example, the cache memory before activating the word lines WL.

As shown in FIG. 10 again, the motion vector detection circuit 111 further has an absolute-difference-value-sum-holding portion 125 for holding, for each reference block, a plurality of sums of absolute difference values generated by the absolute-difference-value-holding portion 124.

The motion vector detection circuit 111 further has a minimum sum decision portion 126 for detecting a motion vector for each reference block based on a plurality of sums of absolute difference values held for each reference block in the absolute-difference-value-sum-holding portion 125, a motion-vector-holding portion 127 for holding the motion vector detected by this minimum sum decision portion 126, and an output terminal 128 for sequentially outputting a motion vector MV of each reference block held in this motion-vector-holding portion 127. The minimum sum decision portion 126 detects a position of a candidate block that generates a minimum sum of absolute difference values, as a motion vector.

The following will describe operations of the motion vector detection circuit 111 shown in FIG. 10.

The image signal Di input to the input terminal 121 is accumulated in the reference frame memory portion 122a that constitutes the memory portion 122, as an image signal of a reference frame. Then, an image signal of the immediately preceding frame stored in the reference frame memory portion 122a is read and accumulated in the search frame memory portion 122b, as an image signal of a search frame. In this case, eight-bit straight binary format pixel data read from the reference frame memory portion 122a is converted into two's complement format pixel data by the convert-to-two's-complement portion 123 provided outside the memory portion 122 and written into the search frame memory portion 122b as nine-bit pixel data.

The reference frame memory portion 122a and the search frame memory portion 122b are each comprised of the memory blocks 10 (see FIG. 11). Their memory cell array 20 is comprised of the memory cell array portion 20a that corresponds to the reference frame memory portion 122a and the memory cell array portion 20b that corresponds to the search frame memory portion 122b (see FIG. 12). The memory cell array portions 20a and 20b are formed consecutively in the row direction, in which the bit lines BL extend.

When a plurality of word lines WL related to pixel data of each line of the memory cell array portions 20a and 20b is activated simultaneously, charges accumulated in the capacitors C of the plurality of memory cells ML connected to the plurality of word lines WL related to the activated two items of pixel data are combined along each bit line BL.

The column address decoder 51 secures its connection with one bit line BL connected to a column directional predetermined memory cell ML in the memory cell array 20, to output a voltage signal having a value that corresponds to a total amount of charges obtained along the bit line BL to which the connection is secured. A digital signal having a value that corresponds to that total amount of charges is obtained from the A/D converter 53.

Since pixel data that constitutes the image signal Di of each reference frame is stored in straight binary format in each unit A of the memory cell array portion 20a and pixel data that constitutes an image signal of each search frame is stored in two's complement format in each unit B of the memory cell array portion 20b and also the A/D converter 53 performs conversion from an analog signal to a digital signal as well as conversion into an absolute value, this digital signal provides an absolute difference value obtained by further converting, into an absolute value, difference data obtained by subtracting the pixel data of the search frame from the pixel data of the reference frame.

By sequentially changing one bit line BL to which connection is secured by the column address decoder 51, an absolute difference value that corresponds to each of the bit lines BL is obtained sequentially from the A/D converter 53. That is, an absolute difference value of one line is sequentially obtained between a predetermined line of the reference frame and a predetermined line of the search frame.

Further, positions of such lines in the memory cell array portion 20b as to be activated are changed with respect to the lines in the memory cell array portion 20a to be activated, to obtain an absolute difference value between pixel data of a predetermined line of a reference frame and pixel data of a line of a search frame that is shifted by a predetermined number of lines therefrom vertically (in the row direction).

Further, a storage position of the pixel data stored in the memory cell array portion 20a or 20b is moved horizontally (in the column direction), to obtain an absolute difference value between pixel data of a predetermined pixel in the reference frame and pixel data of a pixel in the search frame that is shifted by a predetermined number of pixels therefrom horizontally.

Accordingly, for each pixel of the reference frame, the memory portion 122 generates an absolute difference value between pixel data of that pixel and pixel data of each of the plural search positions of the search frame. It is to be noted that if one frame of image has a size of W×H number of pixels and a search range has a horizontal size of sw number of pixels (+xa through −xb) and a vertical size of sh number of pixels (+ya through −yb), an absolute difference value is generated, for each of the W×H number of pixels of the reference frame, between pixel data of this pixel and pixel data of each of the sw×sh number of search positions of the search frame (see FIG. 17).

It is to be noted that pixel data of one line stored in a plurality of memory cells ML in the memory cell array portions 20a and 20b corresponding to word lines WL to be activated is saved in the cache memories 122c and 122d respectively before the word lines WL are activated (see FIG. 10). Then, as described above, after an absolute difference value of one line is obtained from the A/D converter 53, the data stored in these cache memories 122c and 122d is used to restore the meaningless storage data stored in the plurality of memory cells ML to the original state.

An absolute difference value generated by the memory portion 122 is supplied to the absolute-difference-value-holding portion 124 and stored in it. This absolute-difference-value-holding portion 124 is constituted of the memory block 60 (see FIG. 20). If each frame of image has a size of W×H number of pixels and a search range has a horizontal size of sw number of pixels and a vertical size of sh number of pixels, the memory cell array 70 has such a configuration that at least sw×sh number of units A are arranged in a column direction and at least W×H number of units A are arranged in a row direction (see FIG. 21).

In this memory cell array 70, as shown in FIG. 22, positions of row directional units A correspond to positions of the W×H number of pixels in the reference frame and positions of column directional units A correspond to positions of the sw×sh number of search positions of the search frame. In each of units A of this memory cell array 20, the corresponding absolute difference value is held (see FIG. 17).

A plurality of word lines WL is activated simultaneously that is related to the row directional units A of the memory cell array 70 that correspond to the positions of the bw×bh number of pixels in a predetermined reference block, to combine charges accumulated in capacitors C of a plurality of memory cells ML connected to the plurality of activated word lines WL related to the bw×bh number of units A along each bit line BL.

In this condition, the column address decoder 51 is supplied with column addresses via the address buffer 52. Corresponding to the column addresses, the column address decoder 51 secures its connection with one bit line BL connected to a column directional predetermined memory cell ML in the memory cell array 70. Accordingly, a voltage signal having a value that corresponds to a total amount of charges obtained along the bit line BL to which the connection is secured is output from the column address decoder 51. Therefore, the A/D converter 53 provides a digital signal having a value that corresponds to the total amount of charges obtained along the bit line BL to which that connection is secured.

Since the total amount of charges obtained along each bit line BL corresponds to a result of adding up the bw×bh number of absolute difference values between a predetermined reference block and a predetermined candidate block in a search range of a search frame corresponding to this predetermined reference block, this digital signal provides a sum of absolute difference values that indicates this added up result.

In this case, by sequentially changing one bit line BL to which connection is secured by the column address decoder 51, a sum of absolute difference values between the predetermined reference block and each of the sw×sh number of candidate blocks in the search range of the search frame corresponding to this predetermined reference block is obtained sequentially from the A/D converter 53. Further, sums of absolute difference values related to other reference blocks are also obtained by causing a plurality of word lines WL which are to be activated and are related to row directional units A corresponding to bw×bh number of pixel positions in the memory cell array 70 to correspond to other reference blocks.

Accordingly, a sum of absolute difference values is generated by the absolute-difference-value-holding portion 124, for each of the reference blocks of a reference frame, between that reference block and each of the sw×sh number of candidate blocks in a search range of a search frame corresponding to this reference block.

The plurality of sums of absolute difference values for each of the reference blocks is supplied to the absolute-difference-value-sum-holding portion 125 and held in it. Based on the plurality of sums of absolute difference values thus held in the absolute-difference-value-sum-holding portion 125 for each of the reference blocks, the minimum sum decision portion 126 detects a position of a candidate block generating a minimum sum of absolute difference values as a motion vector. This detected motion vector is held in the motion-vector-holding portion 127.

The motion vectors in accordance with the reference blocks held in the motion-vector-holding portion 127 are read sequentially. These read motion vectors MV are provided to the output terminal 128. The output motion vectors MV are supplied to the above-described motion compensation circuit 110 (see FIG. 5), to be used in motion compensation processing.

A flowchart of FIG. 25 shows a procedure for detecting a motion vector MV in the above-described motion vector detection circuit 111.

First, at step ST1, the process starts and, at step ST2, reads an image signal Di stored in the reference frame memory portion 122*a* in the memory portion 122 and converts this straight binary format data into two's complement format data by using the convert-to-two's-complement portion 123 and then writes it as an image signal of a search frame into the search frame memory portion 122*b* in the memory portion 122. At step ST3, the process inputs the image signal Di of a reference frame from the input terminal 121 and writes this image signal to the reference frame memory portion 122*a* in the memory portion 122.

Next, at step ST4, to simultaneously activate a plurality of word lines WL related to pixel data of one line of each of the memory cell array portions 20*a* and 20*b* corresponding to the frame memory portions 122*a* and 122*b* respectively, the process reads pixel data of one line of each thereof (reference line data and search line data) from the memory cell array portions 20*a* and 20*b* and saves it in the cache memories 122*c* and 122*d* z respectively.

Next, at step ST5, the process simultaneously activates a plurality of word lines WL related to pixel data of one line of each of the memory cell array portions 20*a* and 20*b* to read reference line data and search line data simultaneously, thereby obtaining an absolute difference value of one line and holding it in the absolute-difference-value-holding portion 124. At step ST6, the process writes back the reference line data saved in the cache memory 122*c* into the reference frame memory portion 122*a*. At step ST7, on the other hand, the process moves a storage position of the search line data saved in the cache memory 122*d* horizontally (in the column direction), to write the data back into the search frame memory portion 122*b*.

At step ST8, the process decides whether processing has ended which obtains an absolute difference value between target reference line data and all the search line data that corresponds to a search range. It is to be noted that for each reference line data, it is necessary to generate sw×sh number of lines of absolute difference values finally (see FIG. 17). If the processing has not ended yet, the process returns to step ST4, the process shifts to processing for obtaining an absolute difference value between the target reference line data and the next search line data.

If it is decided that the processing has ended at step ST8, the process goes to step ST9. At step ST9, the process decides whether the processing of obtaining an absolute difference value has ended for all the reference line data. If such is not the case, the process returns to step ST4, the process shifts to processing for obtaining an absolute difference value with the next reference line data.

If it is decided that the processing has ended at step ST9, the process goes to step ST10. At this step ST10, the process sequentially obtains from the absolute-difference-value-holding portion 124 a sum of absolute difference values between a target reference block and each of the candidate blocks in a search range corresponding to this reference block and holds it in the absolute-difference-value-sum-holding portion 125.

Next, at step ST11, based on the plurality of sums of absolute difference values related to the target reference block held in the absolute-difference-value-sum-holding portion 125, the process detects a position of a candidate block that generates a minimum sum of these absolute difference values, as a motion vector. At step ST12, the process holds this detected motion vector in the motion-vector-holding portion 127.

Next, at step ST13, the process decides whether the above-described motion vector detection processing has ended for all of the reference blocks of the reference frame. If such is not the case, the process returns to step ST10, the process shifts to processing for detecting a motion vector that corresponds to the next reference block. Otherwise, at step ST14 the process sequentially outputs the motion vectors MV that correspond to these reference blocks held in the motion-vector-holding portion 127 and, at step ST15, ends the processing.

In the present embodiment, for each pixel of a reference frame, the memory portion 122 generates an absolute difference value between pixel data of this pixel and pixel data of each of the plural search positions of a reference frame. This memory portion 122 stores the pixel data of the reference frame in straight binary format in unit A comprised of a plurality of memory cells ML arranged in a direction in which the bit lines BL extend and also stores the pixel data of the search frame in two's complement format in unit B comprised of a plurality of memory cells ML arranged in a direction in which the bit lines BL extend beforehand and simultaneously activates word lines WL related to the pixel data of these reference and search frames, to combine charges accumulated in capacitors C of the plurality of memory cells ML connected to this plurality of word lines WL along one bit line BL, thereby obtaining a digital signal that has a value corresponding to this total amount of changes, as an absolute difference value.

Therefore, processing of obtaining an absolute difference value between the pixel data of the reference frame and that of the search frame is performed simultaneously with reading of the pixel data, thereby enabling obtaining the absolute difference value speedily. Further, it is not necessary to provide a separate subtracter or convert-to-absolute circuit, thereby enabling the device to be inexpensively configured.

Further, in the present embodiment, for each of the reference blocks in a reference frame, the absolute-difference-value-holding portion 124 generates a sum of absolute difference values between this reference block and each of the plural candidate blocks in a search range of a search frame corresponding to this reference block. This absolute-difference-value-holding portion 124 stores an absolute difference value in each of the units A each of which is comprised of a plurality of memory cells ML arranged in a direction in which the bit lines BL extend beforehand and simultaneously activates word lines WL related to the plurality of absolute difference values, to combine charges accumulated in capacitors C of the plurality of memory cells ML connected to this plurality of word lines WL along one bit line BL, thereby obtaining a digital signal that has a value corresponding to this total amount of changes, as an absolute difference value. Therefore, processing of adding up a plurality of absolute difference values is performed simultaneously with reading of the absolute difference values, thereby enabling the sum of absolute difference values to be speedily obtained. Further, it is not necessary to provide a separate adder, thereby enabling the device to be inexpensively configured.

Further, in the present embodiment, the A/D converter 53 can convert a tone, so that if the A/D converter 53 can also alter the number of bits of that output digital signal, no dedicated circuit is necessary, thereby facilitating a tone operation.

Further, in the present embodiment, for each pixel of a reference frame, the memory portion 122 generates an absolute difference value between pixel data of this pixel and pixel data of each of the plural search positions of a search frame and, next the absolute-difference-value-holding portion 124 uses this generated absolute difference value, for each of the reference blocks in the reference frame, to generate a sum of absolute difference values between this reference block and each of the plurality of candidate blocks in a search range of a search frame corresponding to this reference block, so that based on the generated plurality of sums of absolute difference values, a motion vector that corresponds to this reference block is detected for each of the reference blocks in the reference frame. It is thus possible to detect a motion vector speedily and inexpensively.

Although in the above embodiment, the memory cells ML of the memory cell arrays 20 and 70 have been described to be of the DRAM structure, the present invention is not limited to it. In short, it is necessary only to be capable of combining charges accumulated in the capacitors of a plurality of memory cells connected to a plurality of activated word lines along one bit line.

Although the above embodiment has been described with reference to a case where the present invention is applied to detection of a motion vector and the first frame is a reference frame and the second frame is a search frame, the present invention is not limited to it.

Although in the above embodiment, such unit A or B has been described that its eight or nine memory cells ML store one item of data, the number of memory cells ML that constitute unit A or B is not limited to them.

In the above embodiment, by assigning capacitance that corresponds to a weight of this bit to a capacitor C of the memory cell ML that stores data of each bit, it is possible to constitute unit A that stores eight-bit data of only eight memory cells ML. However, if the memory cells ML have the same capacitance of their capacitors C, unit A can be comprised of $(2^8-1)$ number of memory cells ML because it is necessary to be capable of accumulating an amount of charges that corresponds to 256 tones. This holds true also with unit B.

Further, unit A that stores, for example, eight-bit data can be comprised not of eight memory cells ML but of a smaller number of memory cells ML. For example, unit A can be comprised of four memory cells ML. In this case, in the capacitor C of each of the memory cells ML, charge of two bits is respectively accumulated.

To store eight-bit data of, for example, "10000101", an amount of charge that corresponds to "01", that is, "1" in decimal representation can be accumulated in the first memory cell ML from the LSB side, an amount of charge that corresponds to "0100", that is, "4" in decimal representation can be accumulated in the second memory cell ML from the LSB side, an amount of charge that corresponds to "000000", that is, "0" in decimal representation can be accumulated in the third memory cell ML z from the LSB side, and an amount of charge that corresponds to "10000000", that is, "128" in decimal representation can be accumulated in the fourth memory cell ML from the LSB side. In this case, the second, third, and fourth capacitors of the four memory cells ML can be assigned capacitance of 4p, 16p, and 64p respectively, assuming that the capacitance of the capacitor C of the first memory cell ML is p.

Although in the above embodiment, binary data has been stored in each unit A, n-ary data of each digit can be stored in each of the memory cells ML of each unit A, to perform n-ary operations. In this case, the data can be stored by accumulating an amount of charge that corresponds to a value of the relevant digit in the capacitor C of each of the memory cells ML of each unit A.

For example, to store data of "235" in decimal representation, an amount of change that corresponds to "5" can be accumulated in the capacitor C of a memory cell ML which stores ones digit, an amount of change that corresponds to "3×10" can be accumulated in the capacitor C of a memory cell ML which stores tens digit, and an amount of change that corresponds to "2×100" can be accumulated in the capacitor C of a memory cell ML which stores hundreds digit. Of course, the capacitor C of each of the memory cells ML that corresponds to each of the digits needs to have a capacity that can accumulate a maximum amount of charge of each of the digits.

Although in the above embodiment, addition and subtraction have been given as examples of operations, multiplication or division can be performed by devising a format, an arrangement, etc. of data to be input to each unit. For example, to perform a multiplication of M×N, a numeral M can be copied to N number of units so that the above-described addition may be performed subsequently on the N number of units.

A memory device related to the present invention has such a configuration that a plurality of word lines is activated simultaneously to combine charges accumulated in capacitors of a plurality of memory cells connected to this plurality of word lines along one bit line and output a digital signal having a value that corresponds to a total amount of these charges, to enable simultaneous processing of data reading and computing, thereby improving the computing speed and reducing costs due to fewer computing units required.

Another memory device related to the present invention stores, in straight binary format, pixel data of a first frame in a unit comprised of a plurality of memory cells arranged in a direction in which bit lines extend, stores in two's complement format pixel data of a second frame in a unit comprised of a plurality of memory cells arranged in a direction in which the bit lines extend, and simultaneously activates word lines related to the pixel data of these first and second frames to combine, along one bit line, charges accumulated in capacitors of a plurality of memory cells connected to this plurality of word lines and output a digital signal having a value that corresponds to a total amount of these charges, thereby enabling speedily and inexpensively obtaining difference data between the pixel data of the first frame and the pixel data of the second frame.

A further memory device related to the present invention stores data in each of the units which are each comprised of a plurality of memory cells arranged in a direction in which bit lines extend and simultaneously activates word lines related to a plurality of data pieces to combine, along one bit line, charges accumulated in capacitors of the plurality of memory cells connected to this plurality of word lines and output a digital signal having a value that corresponds to a total amount of these charges, thereby enabling added-up data of the plural items of data to be speedily and inexpensively obtained.

A device and method for detecting a motion vector related to the present invention generates, for each pixel of a reference frame, an absolute difference value between pixel data of that pixel and pixel data of each of the plural search positions of a search frame, uses this generated absolute difference value to generate, for each reference block of the reference frame, a sum of absolute difference values between that reference block and each of the plural candidate blocks that corresponds to this reference block in a search range of the search frame, and detects a motion vector in accordance with this reference block based on this generated plurality of sums of absolute difference values for each of the reference blocks of the reference frame, thereby detecting the motion vector speedily and inexpensively.

INDUSTRIAL APPLICABILITY

As described above, a memory device and a device and a method for detecting a motion vector related to the present invention could well be applied to use etc. for detecting a motion vector by using, for example, a motion compensation predictive encoding device.

The invention claimed is:

1. A motion vector detection device comprising:
an absolute difference value generation unit configured to generate, using an image signal of a reference frame and an image signal of a search frame, for each pixel of the reference frame an absolute difference value between pixel data of the respective pixel of the reference frame and pixel data of each of a plurality of search positions of the search frame, the absolute difference value between the pixel data of the respective pixel and the pixel data of a respective one of the plurality of search positions of the search frame being generated based on a total amount of charges obtained from a plurality of memory cells, connected along a same bit line, storing the pixel data of the respective pixel and the respective one of the plurality of search positions of the search frame;

an absolute difference value sum generation unit configured to generate, using the absolute difference value generated by the absolute difference value generation unit, for each reference block of the reference frame a sum of absolute difference values between the respective reference block and a plurality of candidate blocks, each corresponding to the respective reference block, in a search range of the search frame; and a motion vector detection unit configured to detect for each of the reference blocks of the reference frame a motion vector that corresponds to the respective reference block, based on the plurality of sums of absolute difference values generated by the absolute difference value sum generation unit.

2. The motion vector detection device according to claim 1, wherein the absolute difference value generation unit comprises:
a first frame memory portion including a first plurality of memory cells connected to bit lines and word lines, respectively, and arranged in a matrix, to store the image signal of the reference frame, and
a second frame memory portion including a second plurality of memory cells connected to the bit lines and word lines, respectively, and arranged in a matrix, to store the image signal of the search frame;

the first frame memory portion and the second frame memory portion are formed consecutively in a row direction, in which the bit lines extend;

in the first frame memory portion and the second frame memory portion, charges accumulated in capacitors of a plurality of memory cells connected to a plurality of activated word lines can be combined along one bit line;

in each of the first frame memory portion and the second frame memory portion, a plurality of memory cells connected to each of the bit lines is divided into units, each including a predetermined number of memory cells that are connected to a predetermined number of word lines, to store one item of pixel data in each of the divided units;

each unit of the first frame memory portion stores the pixel data of the image signal of the reference frame in straight binary format and each unit of the second frame memory portion stores the pixel data of the image signal of the search frame in two's complement format; and the absolute difference value generation unit comprises:
an activation unit configured to simultaneously activate a first plurality of word lines related to predetermined data in the first frame memory portion and a second plurality of word lines related to predetermined data in the second frame memory portion,
a storage position moving unit configured to move in the column direction a storage position of the pixel data stored in the first frame memory portion or the second frame memory portion,
a bit line selection unit configured to select any one of the plurality of bit lines, and
a signal output unit configured to output a digital signal having a value that corresponds to a total amount of charges obtained along the bit line selected by the bit line selection unit.

3. The motion vector detection device according to claim 1, wherein the absolute difference value sum generation unit comprises a memory portion including a plurality of memory cells connected to bit lines and word lines, respectively, and arranged in a matrix;

in the memory portion, charges accumulated in capacitors of a plurality of memory cells connected to a plurality of activated word lines can be combined along one bit line;

in the memory portion, a plurality of memory cells connected to each of the bit lines is divided into units, each including a predetermined number of memory cells that are connected to a predetermined number of word lines;

the number of units included in the memory portion corresponds to a plurality of pixel positions in one frame in a row direction, in which the bit lines extend, and corresponds to search positions in a column direction, in which the word lines extend;

a plurality of units of each row in the memory portion stores data of the absolute difference value between the pixel data of pixel positions in the reference frame and the pixel data of each of the plurality of search positions of the search frame correspondingly; and the absolute difference value sum generation comprises:
  an activation unit configured to simultaneously activate word lines related to a unit corresponding to a pixel position of each pixel that constitutes a reference block of the reference frame,
  a bit line selection unit configured to select any one of the plurality of bit lines, and
  a signal output unit configured to output a digital signal having a value that corresponds to a total amount of charges obtained along the bit line selected by the bit line selection unit.

4. A motion vector detection method comprising:

generating, using an image signal of a reference frame and an image signal of a search frame, for each pixel of the reference frame an absolute difference value between pixel data of the respective pixel of the reference frame and pixel data of a plurality of search positions of the search frame, the absolute difference value between the pixel data of the respective pixel and the pixel data of a respective one of the plurality of search positions of the search frame being generated based on a total amount of charges obtained from a plurality of memory cells, connected along a same bit line, storing the pixel data of the respective pixel and the respective one of the plurality of search positions of the search frame;

generating, using the absolute difference value generated in the step of generating the absolute difference value, for each reference block of the reference frame a sum of absolute difference values between the respective reference block and a plurality of candidate blocks, each corresponding to the respective reference block, in a search range of the search frame; and detecting for each of the reference blocks of the reference frame a motion vector that corresponds to the respective reference block based on the plurality of the sums of absolute difference values generated in the step of generating the sum of absolute difference values.

5. A motion vector detection device comprising:

absolute difference value generation means for generating, using an image signal of a reference frame and an image signal of a search frame, for each pixel of the reference frame an absolute difference value between pixel data of the respective pixel of the reference frame and pixel data of each of a plurality of search positions of the search frame, the absolute difference value between the pixel data of the respective pixel and the pixel data of a respective one of the plurality of search positions of the search frame being generated based on a total amount of charges obtained from a plurality of memory cells, connected along a same bit line, storing pixel data of the respective pixel and the respective one of the plurality of search positions of the search frame;

absolute difference value sum generation means for generating, using the absolute difference value generated by the absolute difference value generation means, for each reference block of the reference frame a sum of absolute difference values between the respective reference block and a plurality of candidate blocks, each corresponding to the respective reference block, in a search range of the search frame; and a motion vector detection means for detecting for each of the reference blocks of the reference frame a motion vector that corresponds to the respective reference block, based on the plurality of sums of absolute difference values generated by the absolute difference value sum generation means.

* * * * *